US010718325B2

(12) United States Patent
Watanabe et al.

(10) Patent No.: US 10,718,325 B2
(45) Date of Patent: Jul. 21, 2020

(54) LIGHT LOAD ABNORMALITY DETERMINATION METHOD FOR ELECTRIC OIL PUMP

(71) Applicant: MIKUNI CORPORATION, Tokyo (JP)

(72) Inventors: Kenichi Watanabe, Odawara (JP); Naoki Kobayashi, Odawara (JP); Kazuhiro Fujiwara, Odawara (JP); Takashi Doi, Odawara (JP)

(73) Assignee: MIKUNI CORPORATION, Tokyo (JP)

( * ) Notice: Subject to any disclaimer, the term of this patent is extended or adjusted under 35 U.S.C. 154(b) by 112 days.

(21) Appl. No.: 16/096,133

(22) PCT Filed: Apr. 12, 2017

(86) PCT No.: PCT/JP2017/014952
§ 371 (c)(1),
(2) Date: Oct. 24, 2018

(87) PCT Pub. No.: WO2017/187982
PCT Pub. Date: Feb. 11, 2017

(65) Prior Publication Data
US 2019/0136854 A1 May 9, 2019

(30) Foreign Application Priority Data
Apr. 25, 2016 (JP) .................. 2016-086870

(51) Int. Cl.
*F04B 51/00* (2006.01)
*F04B 49/10* (2006.01)
(Continued)

(52) U.S. Cl.
CPC .............. *F04B 51/00* (2013.01); *F04B 49/10* (2013.01); *G01R 31/343* (2013.01);
(Continued)

(58) Field of Classification Search
USPC ......................................................... 73/168
See application file for complete search history.

(56) References Cited

U.S. PATENT DOCUMENTS

| 2012/0244012 A1* | 9/2012 | Kigure | ................... F04B 17/03 417/32 |
| 2012/0245820 A1* | 9/2012 | Miyamoto | .............. F04B 49/20 701/102 |

(Continued)

FOREIGN PATENT DOCUMENTS

| CN | 105927528 A | * | 9/2016 | |
| EP | 2428705 A1 | * | 3/2012 | ............. F16H 61/12 |

(Continued)

OTHER PUBLICATIONS

International Search Report dated Jun. 27, 2017 in corresponding International Patent Application No. PCT/JP2017/014952.

*Primary Examiner* — Andre J Allen

(57) ABSTRACT

A light load abnormality determination method for an electric oil pump (3) that circulates oil to an object to be cooled by the electric oil pump driven by a motor (11), the method comprising: a detection step (41) to detect a current flowing through the motor, a voltage supplied to the motor, and a rotation speed of the motor; a calculation step (42) to calculate a piping resistance equivalent value or a reciprocal value of the piping resistance equivalent value, as a load evaluation value for light load abnormality determination, based on the current, the voltage and the rotation speed detected by the detection step; and a light load abnormality determination step (44) to determine a light load abnormality of the electric oil pump based on the load evaluation value.

8 Claims, 17 Drawing Sheets

(51) Int. Cl.
  *H02P 29/024* (2016.01)
  *G01R 31/34* (2020.01)
  *H02P 27/08* (2006.01)

(52) U.S. Cl.
  CPC ........ *H02P 29/024* (2013.01); *H02P 29/0241* (2016.02); *H02P 27/08* (2013.01)

(56) References Cited

U.S. PATENT DOCUMENTS

2013/0251541 A1* 9/2013 Okamoto ................ F04B 49/06
                                                              417/32
2017/0211688 A1* 7/2017 Miyamoto .......... F16H 61/0031

FOREIGN PATENT DOCUMENTS

| JP | 2012057688 A | * | 3/2012 |
| JP | 2012-197848 |  | 10/2012 |
| JP | 5416062 B2 | * | 2/2014 |

* cited by examiner

US 10,718,325 B2

LIGHT LOAD ABNORMALITY DETERMINATION METHOD FOR ELECTRIC OIL PUMP

CROSS REFERENCE TO THE RELATED APPLICATIONS

This application is a National Phase Application under 35 U.S.C. § 371 of PCT International Patent Application No. PCT/JP2017/014952, filed Apr. 12, 2017, which claims Convention priority to Japanese patent application No. 2016-086870, filed Apr. 25, 2016, the entire disclosure of which is herein incorporated by reference as a part of this application.

FIELD OF THE INVENTION

The present invention relates to a light load abnormality determination method for an electric oil pump, and specifically relates to a light load abnormality determination method for an electric oil pump that performs a light load abnormality determination without using a pressure sensor.

BACKGROUND ART

A cooling system in which oil circulated by an electric oil pump is used as a refrigerant, for example, a cooling system installed in a vehicle with an idle stop function and has a configuration that continues to supply oil to a start clutch and a continuously variable transmission and the like during an idle stop is known (See, for example, Patent Document 1).

As shown in FIG. 16, the cooling system is so configured to drive the electric oil pump 55 with the motor 54 to supply the oil in the oil pan 56 to the device 57 to be cooled, thereby cooling the start clutch and the continuously variable transmission that constitute the device 57 to be cooled (See paragraphs 0014, 0015 and FIG. 1).

In this cooling system, the electric oil pump 55 serves as a hydraulic pressure source for the transmission of the idle stop system, and an accurate flow rate control is required. Therefore, in the control unit 50, the motor control unit 52 sets the drive duty based on the motor rotation speed fed back from the motor 54, and the motor drive unit 53 drives the motor 54 based on the drive duty.

Further, the failure detection unit 51 determines the light load abnormality such as a decrease in the amount of oil in the oil pan 56, oil leakage from the hydraulic system piping, idling of the electric oil pump 55, and the like, based on the phase current (current), the rotation speed, and the temperature (oil temperature) of the oil (oil) detected by the temperature sensor 58.

CITATION LIST

Patent Literatue

Patent Document 1: Japanese Unexamined Patent Application Publication No. 2012-197848

SUMMARY OF THE INVENTION

Technical Problem

In the cooling system described in Patent Document 1, the target rotation speed is set higher than the required rotation speed only when the oil temperature is high in the idling state determination, so that the rotation speed of the electric oil pump is intentionally increased, to thereby perform the control to increase the difference in motor current between the normal time and the idle time of the electric oil pump, for the purpose of avoiding a situation in which the difference in motor current between the normal time and the idling time of the electric oil pump is reduced, thereby making it difficult to make a determination based on the motor current (See paragraph 0074, 0075 and FIG. 10).

However, since the load abnormality determination method of the electric oil pump described in Patent Document 1, performs the estimation of the load only by the motor current, it is necessary to variably control the rotation speed of the electric oil pump, that is, the drive duty, in order to increase the difference in the motor current between the normal time and the idle time of the electric oil pump. Further, since the difference in motor current between the normal time and idling time of the electric oil pump appears as a difference in the slope of the relationship between the drive duty and the current, there is a problem that only the load abnormality determination which is dependent on the drive duty can be performed. Furthermore, since, at low temperatures, the viscosity of the oil is high and the intake negative pressure of the electric oil pump becomes too large, so that it is impossible to increase the rotation speed of the motor, and consequently the abnormality can be determined only at high temperatures.

Further, as another type of conventional cooling system, for example, there is a cooling system for a vehicle that is mounted on a hybrid vehicle and cools the vehicle motor and generator as the device to be cooled 68 as shown in FIG. 17. In this cooling system, as shown in FIG. 17, an electric oil pump controller 61 drives an electric oil pump 65 with a motor 64, sucks up oil from the oil pan 66, and supplies the oil to the device to be cooled 68 via an oil cooler 67, so as to cool the vehicle motor and the generator which constitute the device to be cooled 68.

In the cooling system shown in FIG. 17, the accuracy of the flow rate control is not required as much as the system for cooling the transmission of the idle stop system (See FIG. 16). Therefore, in a control unit 63, a microcomputer 631 sets a drive duty corresponding to the oil temperature detected by the oil temperature sensor 69, and the electric oil pump controller 61 drives the motor 64 based on the drive duty, to thereby control the flow rate of the oil pump 65.

In the cooling system shown in FIG. 17, it is possible to consider the configuration in which, for example, a pressure sensor 70 for detecting the pressure (hydraulic pressure) in the hydraulic piping is provided, and the microcomputer 631 of the control unit 63 detects the load abnormality of the electric oil pump 65 based on the hydraulic pressure detected by a pressure sensor 70. In this case, the pressure sensor 70 is required, which makes the cooling system expensive.

The present invention has been made to solve the above-described conventional problems, and for the purpose of providing a light load abnormality determination method for an electric oil pump which can, with an inexpensive configuration, reliably prevent an erroneous determination related to a light load abnormality.

Means to Solve the Problem

In order to solve the above problem, one aspect of the light load abnormality determination method of the electric oil pump according to the present invention comprises: a detection step to detect an electric current flowing through the motor, a voltage supplied to the motor, and a rotation speed of the motor; a calculation step to calculate a piping resistance equivalent value represented by the following formula (1) or a reciprocal value of the piping resistance equivalent value represented by the following formula (2), as a load evaluation value for light load abnormality determination, based on the current, the voltage and the rotation speed detected by the detection step; and a light load abnormality determination step to determine a light load abnormality of the electric oil pump based on the load evaluation value.

$$\text{piping resistance equivalent value} = \text{first coefficient} \times \text{electric current} \times \text{voltage/rotation speed}^2 \quad (1)$$

$$\text{reciprocal value of the piping resistance equivalent value} = \text{second coefficient} \times \text{rotation speed}^2/(\text{electric current} \times \text{voltage}) \quad (2)$$

Further, in one aspect of the light load abnormality determination method of the electric oil pump according to the present invention, the light load abnormality determination step compares the load evaluation value with a threshold value and determines the light load abnormality of the electric oil pump, depending on which side of the threshold value the load evaluation value is present.

Further, one aspect of the light load abnormality determination method of the electric oil pump according to the present invention further comprises a threshold value setting step to set the threshold value.

Further, in one aspect of the light load abnormality determination method of the electric oil pump according to the present invention, the threshold value setting step sets the threshold value corresponding to the piping resistance equivalent value, and the light load abnormality determination step determines that the light load abnormality is present when the piping resistance equivalent value calculated in the calculation step is smaller than the threshold value.

Further, in one aspect of the light load abnormality determination method of the electric oil pump according to the present invention, the threshold value setting step sets the threshold value corresponding to the reciprocal value of the piping resistance equivalent value, and the light load abnormality determination step determines that the light load abnormality is present when the reciprocal value of the piping resistance equivalent value calculated in the calculation step is greater than the threshold value.

Further, in one aspect of the light load abnormality determination method of the electric oil pump according to the present invention, the threshold value setting step sets the threshold value corresponding to the piping resistance equivalent value corresponding to the oil temperature, and the light load abnormality determination step determines that the light load abnormality is present when the piping resistance equivalent value calculated in the calculation step is smaller than the threshold value.

Further, in one aspect of the light load abnormality determination method of the electric oil pump according to the present invention, the threshold value setting step sets the threshold value corresponding to the reciprocal value of the piping resistance equivalent value corresponding to the oil temperature, and the light load abnormality determination step determines that the light load abnormality is present when the reciprocal value of the piping resistance equivalent value calculated in the calculation step is greater than the threshold value.

Further, one aspect of the light load abnormality determination method of the electric oil pump according to the present invention further comprises a drive duty varying step to vary a drive duty of the motor, and a variation amount calculation step to calculate a variation amount of the load evaluation value corresponding to the variation of the drive duty within a predetermined variation range, and the light load abnormality determination step determines a light load abnormality of the electric oil pump based on the variation amount of the load evaluation value.

Effect of the Invention

According to the present invention, it is possible to provide a light load abnormality determination method for an electric oil pump that can, with an inexpensive configuration, reliably prevent an erroneous determination related to a light load abnormality with an inexpensive configuration.

DETAILED DESCRIPTION OF THE INVENTION

Hereinafter, embodiments for carrying out the present invention will be described with reference to the FIGS. 1-15.

Figure 1:
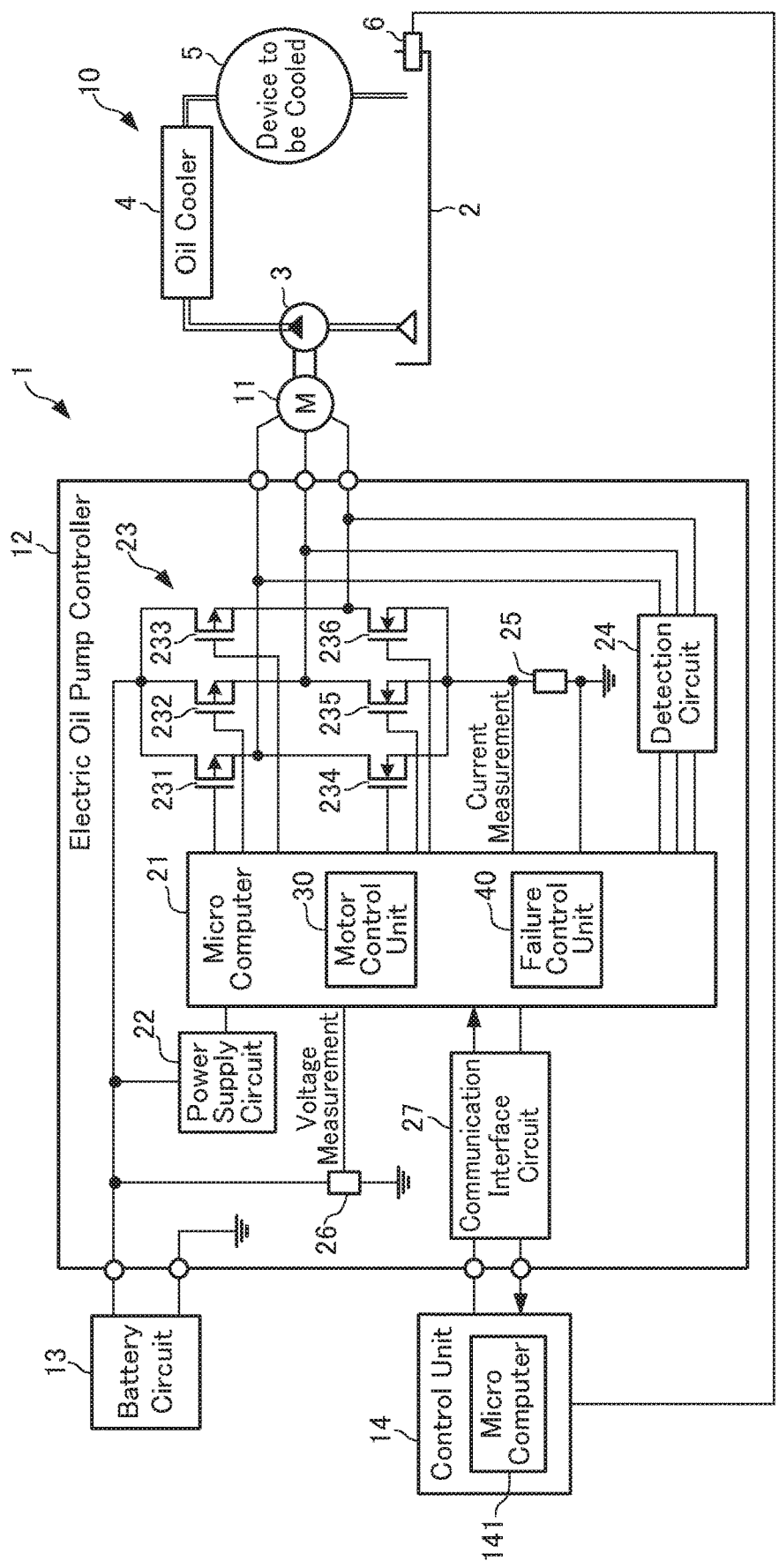
FIG. 1 is a diagram showing a schematic configuration of a cooling system to which a light load abnormality determination method according to an embodiment of the present invention is applied.

FIG. 1 is a diagram showing a schematic configuration of a cooling system to which a light load abnormality determination method according to an embodiment of the present invention is applied. The cooling system 1 is mounted on, for example, a hybrid vehicle and is suitable for cooling a vehicle motor or a generator (generator) which constitutes a device to be cooled 5 by circulating cooling oil.

The cooling system 1 includes a cooling mechanism 10, a motor 11, an electric oil pump controller 12, a battery circuit 13, and a control unit 14.

The cooling mechanism unit 10 is constituted by an oil pan 2, an electric oil pump 3, an oil cooler 4, the device to be cooled 5, and an oil temperature sensor 6.

In the cooling mechanism 10, the electric oil pump 3 is, for example, a rotary volume change pump, sucks up cooling oil stored in an oil reservoir of the oil pan 2, discharges the cooling oil to a downstream pipe, and pressure-feeds the cooling oil to the device 5 to be cooled via the oil cooler 4. The oil cooler 4 dissipates the heat of the passing oil. The device 5 to be cooled is an object to be cooled such as a motor for a vehicle and a generator, and is cooled by oil pumped from the electric oil pump 3. The oil that has cooled the device 5 to be cooled is returned to the oil pan 2.

The oil temperature sensor 6 is provided in the oil pan 2 and detects the temperature (oil temperature) of the cooling oil accumulated in the oil pool of the oil pan 2, and supplies the oil temperature signal indicating the detected oil temperature to the control unit 14.

The motor 11 is a sensorless brushless DC motor, and is configured to drive the electric oil pump 3 under the control of a motor control unit 30 provided in a microcomputer 21 of the electric oil pump controller 12, which will be described later.

The electric oil pump controller 12 performs comprehensive control of the cooling system 1 related to driving of the motor 11 and detection of a failure (light load abnormality) of the electric oil pump 3 an the like, in response to a command from the control unit 14 which is a host controller.

The battery circuit 13 is a secondary power source for supplying operation power to the electric oil pump controller 12 and the microcomputer 21 in the electric oil pump controller 12, which will be described later.

The control unit 14 has a microcomputer 141. The microcomputer 141 is, for example, a general-purpose microcomputer, and the CPU executes a control program to perform various processes. The microcomputer 141 functions as a host controller of the electric oil pump controller 12 by generating various commands for driving the motor 11 on the basis of, for example, the operating state of the vehicle, the oil temperature signal from the oil temperature sensor 6, and the like, and by sending the command to the microcomputer 21.

Next, the configuration of the electric oil pump controller 12 will be described in detail. As shown in FIG. 1, the electric oil pump controller 12 includes the microcomputer 21, a power supply circuit 22, a drive circuit 23, a detection circuit 24, a current measurement circuit 25, a voltage measurement circuit 26, and a communication interface circuit 27.

The microcomputer 21 includes a CPU, a ROM, a RAM, and the like, and at least the motor control unit 30 and the failure control unit 40 are realized by the CPU executing a control program stored in the ROM. The detailed configuration and operation of the motor control unit 30 and a failure control unit 40 will be described in detail later.

The power supply circuit 22 converts the voltage supplied from the battery circuit 13 into a DC voltage and supplies it to the microcomputer 21 as an operating power supply.

The drive circuit 23 is configured to include switching elements 231, 232, 233, 234, 235, 236 for switching a drive current Ii of each phase of the rotor of the motor 11. Switching of the switching elements 231, 232, 233, 234, 235, 236 is controlled by the motor control unit 30.

The detection circuit 24 includes a filter, a comparison circuit, a logic circuit, an A/D converter and the like, and detects a zero cross signal indicating the phase switching timing of the rotor of the motor 11 from the counter electromotive force of the non-conduction phase of the motor 11, and notifies the zero cross signal to the motor control unit 30.

The current measuring circuit 25 includes, for example, a resistance element connected to the driving circuit 23 so that the driving current Ii of each phase of the motor 11 can flow therethrough and an operational amplifier, and converts the voltage drop corresponding to the drive current Ii of each phase flowing in the resistance element into a voltage that can be A/D converted. As described later, the failure control unit 40 can detect the drive current Ii of each phase of the motor 11 based on the voltage drop.

The voltage measuring circuit 26 is composed of, for example, a voltage dividing resistor connected between the electric line between the battery circuit 13 and the driving circuit 23 and GND. The voltage measuring circuit 26 converts the voltage applied to the circuit formed by the battery circuit 13, the driving circuit 23 and the GND to a voltage that can be A/D converted. As described later, the failure control unit 40 can detect this voltage drop as the supply motor supply voltage Vi of the motor 11.

The communication interface circuit 27 communicates with the microcomputer 141 of the control unit 14 and acquires a command from the microcomputer 141 and sends a signal indicating the state of the motor 11 from the microcomputer 21 of the electric oil pump controller 12 to the control unit 14.

Next, the configuration and operation of the motor control unit 30 in the microcomputer 21 of the electric oil pump controller 12 will be described. In the cooling system 1 according to the present embodiment, the microcomputer 21 realizes the motor control unit 30 by executing, for example, a motor control program stored in the ROM by the CPU.

Figure 2:
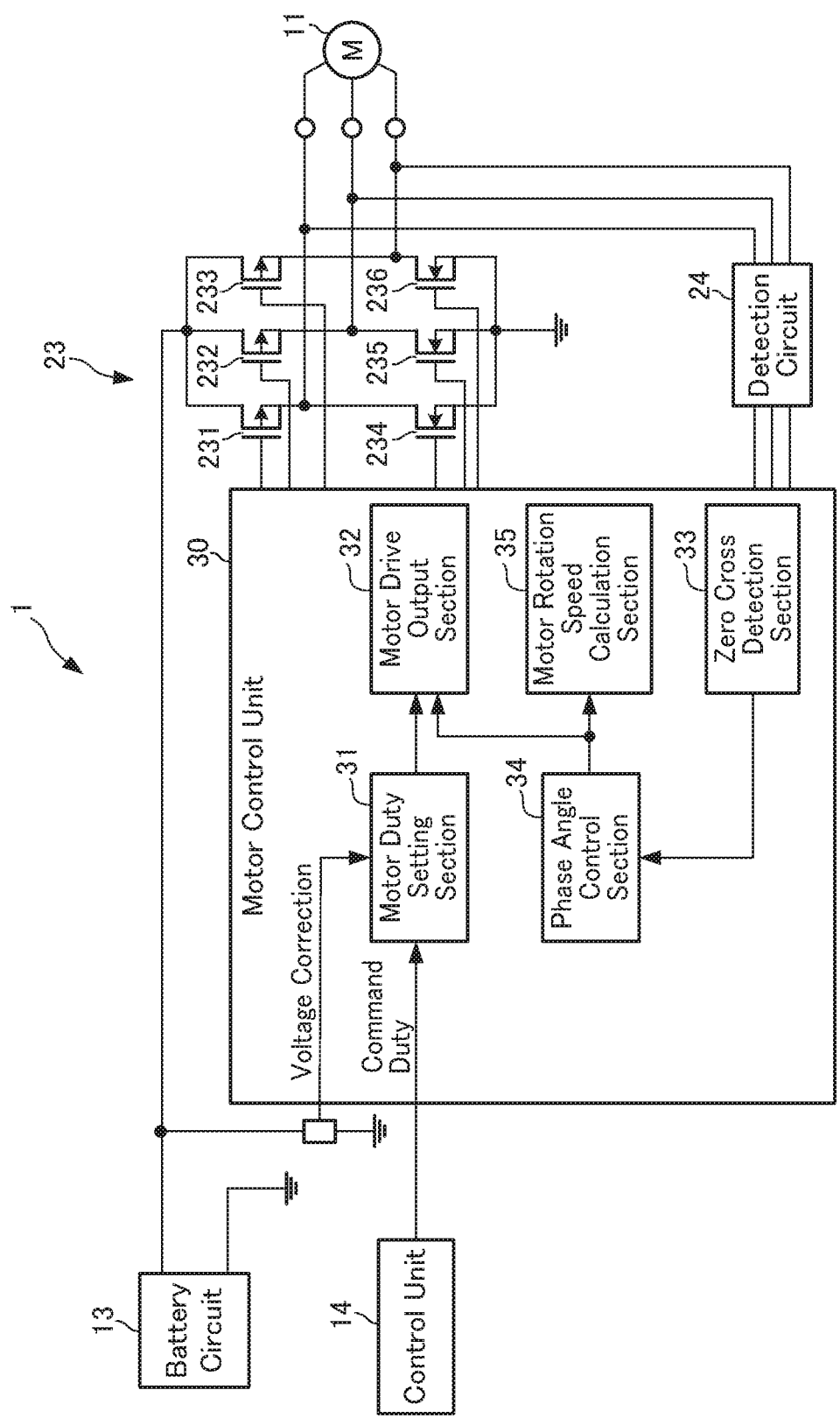
FIG. 2 is a block diagram showing a functional configuration of a motor control unit of the cooling system of FIG. 1.

As shown in FIG. 2, the motor control unit 30 includes a motor duty (Duty) setting section 31, a motor drive output section 32, a zero-cross detection section 33, a phase angle control section 34, and a motor rotation speed calculation section 35.

The motor duty setting section 31, while receiving the command Duty (duty) from the control unit 14, takes in the motor supply voltage Vi after correcting the supply motor supply voltage Vi to the motor 11 detected via the voltage measurement circuit 26, and sets a new motor drive duty (hereinafter referred to as the "drive duty") based on the corrected motor supply voltage Vi and the command Duty.

The motor drive output section 32 transmits the signal to rotate the motor 11 to each of the switching elements 232, 233, 234, 235, and 236 forming a drive circuit 23 with a drive duty set by the motor duty setting section 31 and a drive pattern set by the phase angle control unit 34 to be described later, to thereby drive the motor 11.

The zero-cross detection section 33 takes in the detection result of the zero-cross signal from the detection circuit 24 during rotation of the motor 11, to thereby detect the zero cross.

The phase angle control section 34 sets the energization pattern for the motor drive output section 32 based on the zero cross signal detected by the zero cross detection section 33.

The motor rotation speed calculation section 35 detects the rotation speed Ri of the motor 11 based on the result of the phase angle control by the phase angle control section 34. In this example, the motor rotation speed calculation section 35 detects the drive current Ii flowing in each phase (U, V, W phase) during driving of the motor 11 from the above-described phase angle control result. In addition to this, for example, a configuration may be employed in which the rotation speed Ri and the rotational position of the motor 11 are detected using a sensor signal of an encoder or the like.

In the motor control unit 30 having the above configuration, the motor duty setting section 31 acquires a command Duty from the control unit 14, and sets a drive duty based on the command Duty. In addition, the motor duty setting section 31 measures the supply motor supply voltage Vi from the battery circuit 13 to the motor 11 and corrects the voltage. The motor drive output section 32 drives the motor 11 with the drive duty set by the motor duty setting section 31.

During driving of the motor 11, the zero-cross detection section 33 takes in the detection result of the zero cross signal (See FIG. 3) in the detection circuit 24 so as to detect the zero cross. The phase angle control section 34 sets the energization pattern for driving the motor 11 based on the detection of the zero cross signal by the zero cross detection section 33. The motor drive output section 32 controls the drive of the motor 11 by commanding the drive circuit 23 of the energization pattern. The motor rotation speed calculation section 35 calculates the rotation speed of the motor 11 from the phase angle controlled by the phase angle control section 34.

Figure 3:
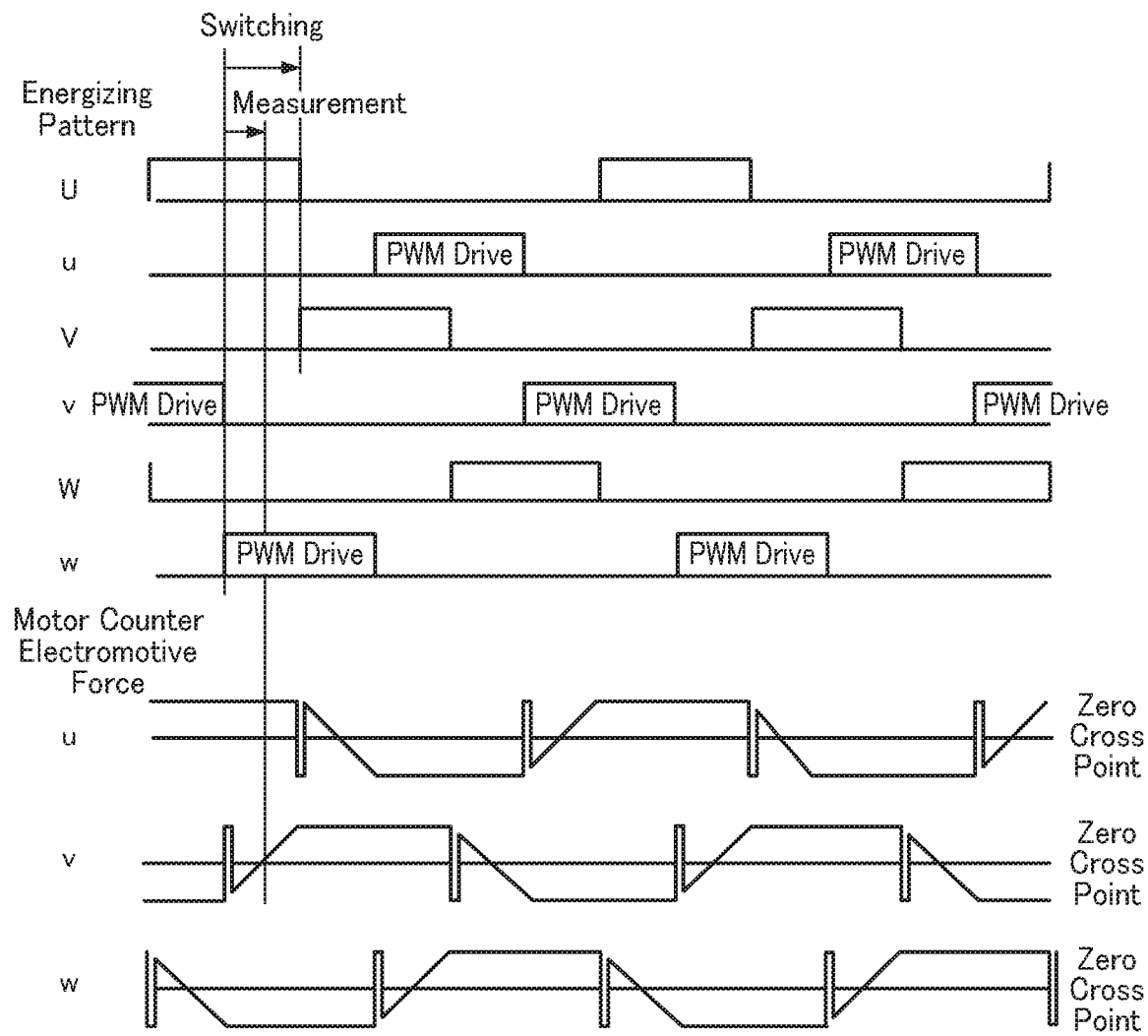
FIG. 3 is a diagram showing a timing chart of motor drive control signals in the motor control unit in FIG. 2.

As described above, the motor control unit 30 controls the rotation speed of the motor 11 by sequentially switching the energization patterns of U, V, W and u, v, w of the drive circuit 23 according to the energization pattern shown in FIG. 3.

Further, the motor control unit 30 controls the drive current Ii of the motor 11 by controlling the pulse width of the PWM drive duty of u, v, w of the drive circuit 23 so as to control the drive torque of the motor 11.

Next, the configuration and operation of the failure control unit 40 in the microcomputer 21 of the electric oil pump controller 12 will be described. In the cooling system 1 according to the present embodiment, the microcomputer 21 realizes the failure control unit 40 by executing, for example, a failure detection control program stored in the ROM by the CPU.

For example, when there is no oil in the lower portion of the generator, which is the device 5 to be cooled, or the piping on the intake/discharge side is disconnected, or the like, the failure control unit 40 determines that the load of the electric oil pump 3 is small.

In particular, the failure control unit 40 according to the present embodiment includes a configuration capable of performing: a detection step to detect a current (phase current) Ii flowing through the motor 11, a voltage Vi supplied to the motor 11, and a rotation speed Ri of the motor 11; a calculation step to calculate a piping resistance equivalent value represented by a formula (1) mentioned hereinafter or a reciprocal value of the piping resistance equivalent value represented by a formula (2) mentioned hereinafter, as a load evaluation value for light load abnormality determination, based on the current Ii, the voltage Vi and the rotation speed Ri detected by the detection step; and a light load abnormality determination step to determine a light load abnormality of the electric oil pump 3 based on the load evaluation value.

Hereinafter, the light load abnormality determination method of the electric oil pump 3 of the cooling system 1 according to the present embodiment will be described in detail according to each embodiment of the failure control unit 40.

First Embodiment

Figure 4:
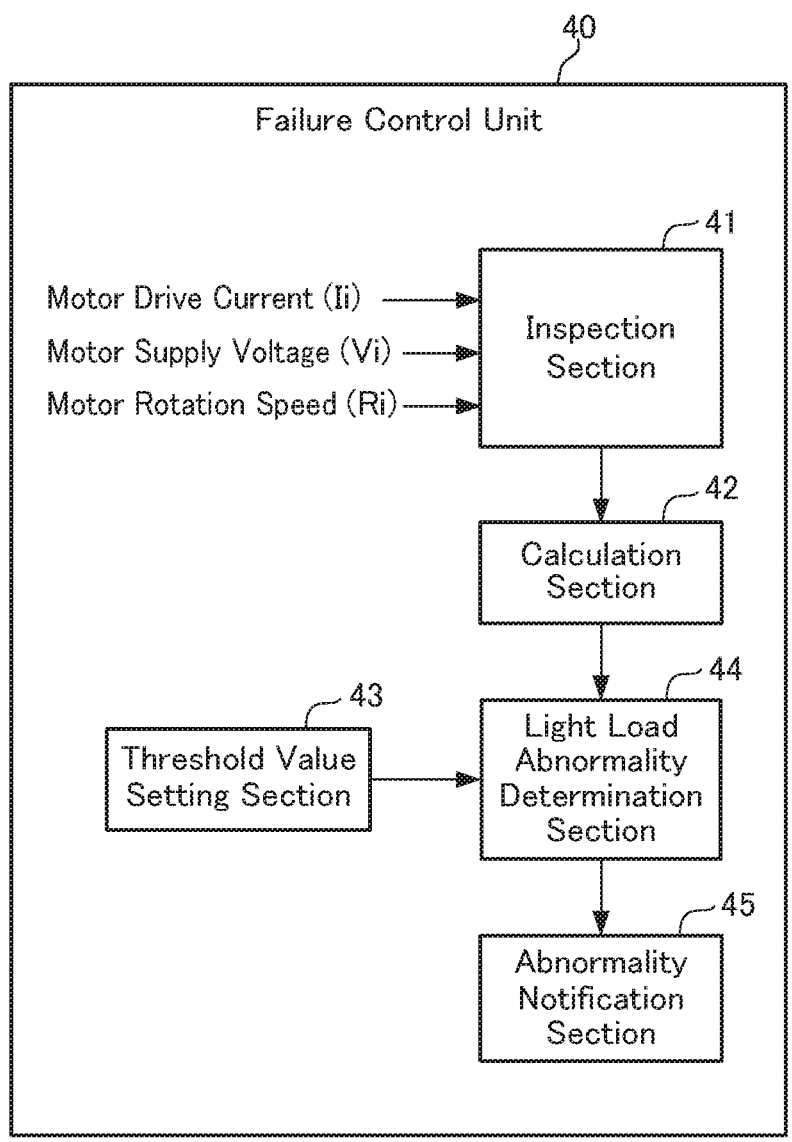
FIG. 4 is a block diagram showing a functional configuration of a failure control unit of the cooling system according to the first and second embodiments.

FIG. 4 is a block diagram showing a functional configuration of the failure control unit 40 of the cooling system 1 according to the first embodiment. As shown in FIG. 4, the failure control unit 40 according to the first embodiment includes an inspection section 41, a calculation section 42, a threshold value setting section 43, a light load abnormality determination section 44, and an abnormality notification section 45.

During the operation of the motor 11 under the control of the motor control unit 30, the inspection section 41 performs the inspection to inspect whether or not the current (phase current) Ii flowing in the motor 11, the motor supply voltage Vi supplied to the motor 11, and the rotation speed Ri of the motor 11 are correctly acquired.

In the inspection process, the inspection section 41 sets the voltage across the current measuring circuit 25 when the driving current Ii flowing through the switching elements 231-236 of the driving circuit 23 during the driving of the motor 11 flows to the current measuring circuit 25, amplified by an operational amplifier, and subjected to A/D conversion, thereby detecting a current (hereinafter referred to as the "motor driving current") Ii flowing through the motor 11 (See FIG. 4).

In the inspection process, the inspection section 41 divides the voltage applied to the circuit formed between the battery circuit 13, the driving circuit 23 and the GND while the motor 11 is being driven by the voltage measuring circuit 26, and divides the voltage applied to the A/D (Vi) (hereinafter referred to as the "motor supply voltage") supplied to the motor 11 (See FIG. 4).

Further, in the inspection process, the inspection section 41 takes in the rotation speed of the motor 11 (hereinafter may be referred to as the "motor rotation speed") Ri (See FIG. 4) calculated by the motor rotation speed calculation section 35 of the motor control unit 30 while driving the motor 11.

As described above, the inspection section 41 detects (inspects) the drive current Ii, the motor supply voltage Vi, and the motor rotation speed Ri sequentially while driving the motor 11.

Based on the drive current Ii, motor supply voltage Vi and motor rotation speed Ri which were inspected by the inspection section 41, the calculation section 42 calculates a load evaluation for evaluating the load of the electric oil pump 3. In the present embodiment, the calculation section 42 calculates a piping resistance equivalent value or a reciprocal value of the piping resistance equivalent value as the load evaluation value of the electric oil pump 3.

Among them, the piping resistance equivalent value can be expressed by the following equation (1). Piping resistance equivalent value=first coefficient×(Ii)×(Vi)/(Ri) 2 (1)

Further, the inverse value of the piping resistance equivalent value can be expressed by the following equation (2) based on the above equation (1). Inverse numerical value of piping resistance equivalent value=second coefficient×(Ri) 2/((Ii)×(Vi))·(2)

The first coefficient and the second coefficient in equations (1) and (2) can be set to appropriate values which are different from each other. In addition, when driving the motor 11 with a constant motor supply voltage Vi supplied to the motor 11, the first coefficient and the second coefficient of the above equations (1) and (2) can be respectively replaced with different coefficients, omitting the motor supply voltage Vi.

The threshold value setting section 43 compares the piping resistance equivalent value calculated as the load evaluation value by the calculation section 42 or the inverse value of the piping resistance equivalent value (hereinafter referred to as "1/piping resistance equivalent value" for convenience), and sets a threshold value used for determining whether or not the light load abnormality of the oil pump 3 is abnormal.

The light-load abnormality determination section 44 compares, for example, the piping resistance equivalent value or 1/piping resistance equivalent value calculated by the calculation section 42 with the above-described threshold value for light load abnormality determination set by the threshold value setting section 43, and determines whether or not a light load abnormality of the electric oil pump 3 is occurring based on the comparison result.

When the light load abnormality determination section 44 determines that the light load abnormality of the electric oil pump 3 is occurring, the abnormality is notified by the abnormality notification section 45. For example, when the cooling system 1 is mounted on a hybrid vehicle, the abnormality notification section 45 may be configured to display on a display unit including a speedometer or the like that a light load abnormality has occurred. Further, the abnormality notification section 45 may output a warning sound together with the above display. Further, the abnormality notification section 45 may, for example, be configured to send an abnormality occurrence signal to the engine ECU, to thereby stop the travel of the hybrid vehicle by the engine ECU.

Next, the light load abnormality determination processing function of the electric oil pump 3 in the failure control unit 40 according to the present embodiment will be described. In the present embodiment, in the failure control unit 40, the calculation section 42 calculates the piping resistance equivalent value by the above equation (1) as the load evaluation value of the electric oil pump 3 based on the drive current Ii, the motor supply voltage Vi and the motor rotation speed Ri which were inspected by the inspection section 41. Further, prior to the light load abnormality determination process of the electric oil pump 3, the threshold value setting section 43 sets an appropriate value of the piping resistance equivalent value as a threshold value for light load abnormality determination.

Specifically, the threshold value setting section 43 is adapted to set an appropriate piping resistance equivalent value that can be commonly used within the drive duty range of 30-80 percent as the above-mentioned threshold value, based on the variation property of the drive duty and the piping resistance equivalent value (hereinafter referred to as "drive duty/piping resistance equivalent value property") shown in FIG. 5.

Figure 5:
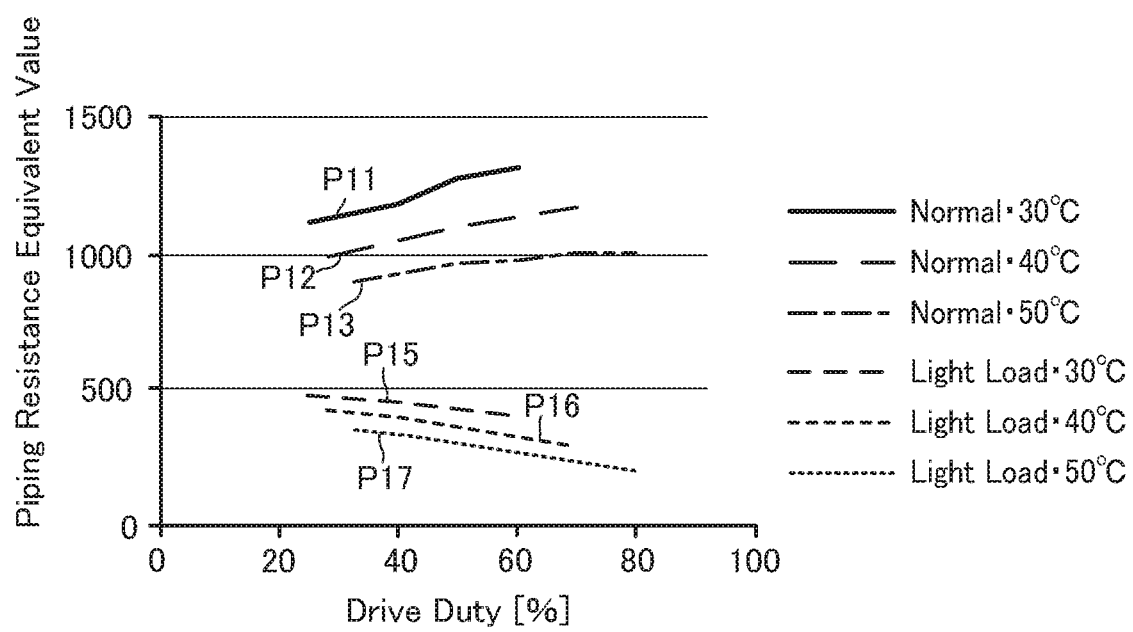
FIG. 5 is a graph showing variation property of a drive duty and a piping resistance equivalent value of the cooling system according to the first embodiment.

In the drive duty/piping resistance equivalent value properties shown in FIG. 5, the properties P11, P12, and P13 indicate the variation properties at the normal time when the oil temperature is 30° C., 40° C., or 50° C., respectively, and when the light load abnormality is not occurring. Likewise, the properties P15, P16, and P17 indicate the variation properties at the light load abnormality time.

According to the drive duty/piping resistance equivalent value properties shown in FIG. 5, in the oil temperature range of 30° C. to 50° C., there is a sufficient difference in order to set a common light load abnormality determination threshold between the properties P11, P12, and P13 in the piping resistance equivalent value/drive duty property in the normal time and the properties P15, P16, and P17 in the piping resistance equivalent value/drive duty properties of the load abnormality time.

It is understood from the foregoing that, from the piping resistance equivalent value/drive duty properties shown in FIG. 5, it can be determined whether or not there is a light load abnormality depending on which side of the threshold value the piping resistance equivalent value is calculated during the driving of the motor 11, by setting a piping resistance equivalent value between the normal value and the abnormal value in FIG. 5, in the case of determining the light load abnormality of the electric oil pump 3 within the range of oil temperature 30° C. to 50° C. and the drive duty 30 to 80 percent.

Here, the processing of each section in the failure determination processing of the failure control unit 40 according to the present embodiment will be described. Hereinafter, the case where the piping resistance equivalent value/drive duty properties shown in FIG. 5, for example, the piping resistance equivalent value="700" was set as a threshold value, will be described, as an example.

In this case, in the failure control unit 40 (See FIG. 4), the threshold value setting section 43 sets the piping resistance equivalent value="700" as the threshold value before performing the failure detection processing. When the motor 11 is driven with this threshold value, the failure control unit 40 performs a light load abnormality determination process of the electric oil pump 3 according to the following flow.

First, in the failure control unit 40, the inspection section 41 inspects whether or not the drive current Ii, the motor supply voltage Vi, and the motor rotation speed Ri are normally detected or acquired. Next, if these are normally detected or acquired, the calculation section 42 applies the above equation (1) based on the drive current Ii, the motor supply voltage Vi, and the motor rotational speed Ri to obtain the piping resistance equivalent value.

Subsequently, the light load abnormality determination section 44 compares the piping resistance equivalent value calculated by the calculation section 42 with the threshold value (piping resistance equivalent value="700") set in the threshold value setting section 43 and determines whether or not there is a light load abnormality based on the comparison result.

Here, when the piping resistance equivalent value is above the threshold value, the light load abnormality determination section 44 determines that the electric oil pump 3 is in a normal state, and determines that a light load abnormality has occurred if the piping resistance equivalent value is below the threshold value (See FIG. 5).

When it is determined by the light load abnormality determination section 44 that a light load abnormality has occurred, the abnormality notification section 45 further performs the control to notify that a light load abnormality has occurred.

As described above, the failure control unit 40 of the cooling system 1 according to the present embodiment is adapted to perform the process of: a detection step in which the inspection section 41 detects the drive current Ii flowing in the motor 11 that drives the electric oil pump 3, the motor supply voltage Vi supplied to the motor 11 and a rotational speed Ri of the motor 11; a calculation step in which the calculation section 42 calculates a piping resistance equivalent value as a load evaluation value based on the driving current Ii, the motor supply voltage Vi and the rotational speed Ri detected in the detection step; and a light load abnormality determination step in which the light load abnormality determination section 44 determines the light load abnormality of the electric oil pump 3 based on the comparison result between the load evaluation value calculated in the calculation step and the threshold value set by the threshold value setting section 43.

Next, the operation and effect of the light load abnormality determination processing of the electric oil pump 3 by the failure control unit 40 according to the present embodiment will be described. As explained above, the piping resistance equivalent value is used for the load abnormality determination, in the present embodiment. The effect thereof is verified by comparing with the case when a determination parameter other than the piping resistance equivalent value was used.

Figure 7:
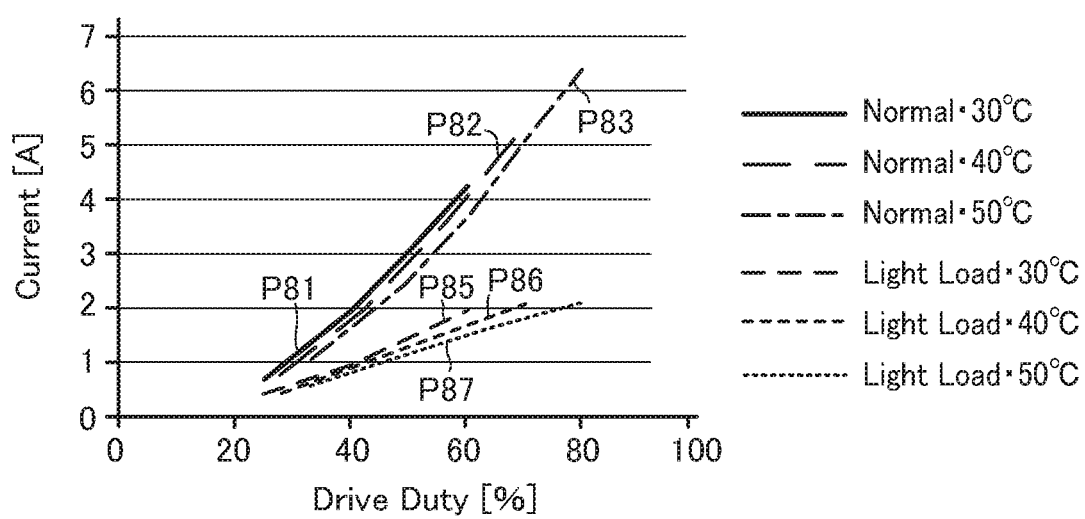
FIG. 7 is a diagram showing a variation property of a drive duty and a motor drive current for verifying the light load abnormality determination method of the cooling system according to the first and second embodiments.
Figure 8:
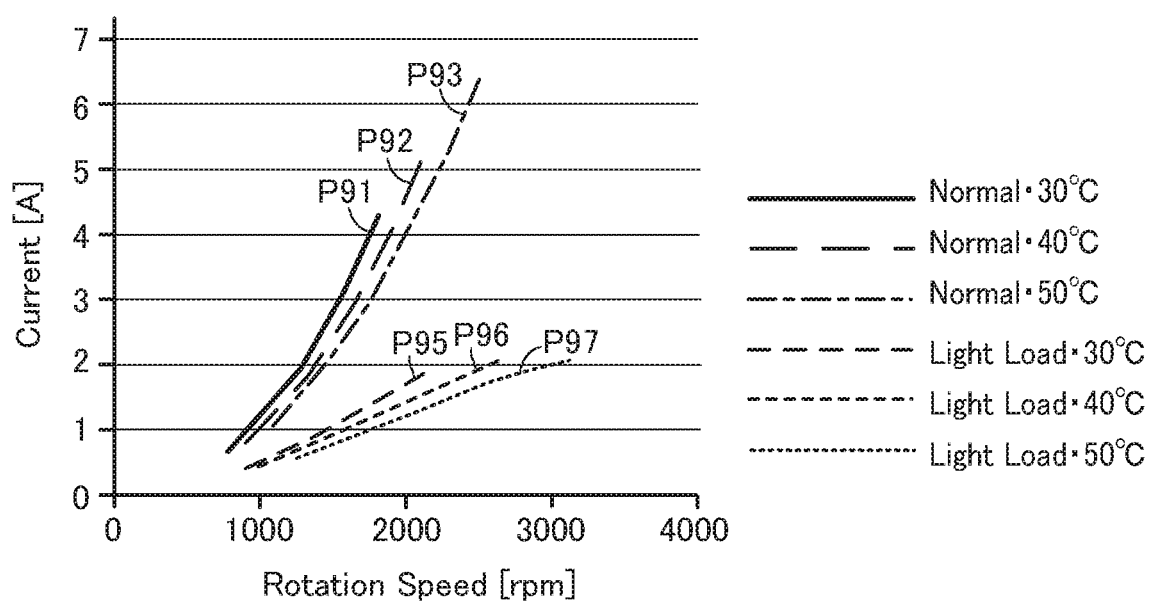
FIG. 8 is a view showing a variation property of a motor rotation speed and a motor drive current for verifying the light load abnormality determination method of the cooling system according to the first and second embodiments.

For the aforementioned verification, the variation properties (drive duty and current property) of the drive duty and the drive current Ii of the cooling system 1 according to the present embodiment are shown in FIG. 7, and the variation properties of the motor rotation speed and the drive current Ii Motor rotation speed/current property) are shown in FIG. 8.

In the drive duty and current properties shown in FIG. 7, the properties P81, P82, and P83 show the variation properties in a normal condition where the oil temperature was 30° C., 40° C., or 50° C., respectively, and there is no load abnormality. Properties P85, P86, and P87 show the variation property when the oil temperature is 30° C., 40° C., or 50° C., respectively, and at the time of load abnormality.

According to the drive duty and current properties shown in FIG. 7, the properties P81, P82, and P83 in the normal state and the properties P85, P86, and P87 in the light load abnormality in the oil temperature range of 30° to 50° indicate that the difference between them becomes smaller as the drive duty becomes smaller. Further, in these drive duty/current properties, there exists no difference region having a width that allows one common threshold value to be set between the properties P81, P82, and P83 at the normal time and the properties P85, P86, and P87 at the light load abnormality time throughout the drive duty range of 30 to 80%.

For this reason, for example, when a value (current value) is set in the vicinity of the center of the values in the normal time and the light load abnormality time as the threshold value for light load abnormality determination based on the drive duty and current property shown in FIG. 7, the determination range of the current value at the time of normal time and the light load abnormality time becomes small particularly in the region where the drive duty is small, thereby making it likely to erroneously determine the normal state as the light load abnormal state. In order to solve this problem, it is necessary to set a threshold corresponding to the drive duty, in which case, the light load abnormality determination process depends on the drive duty.

In addition, in the motor rotation speed/current properties shown in FIG. 8, the properties P91, P92, and P93 indicate the variation properties of when the oil temperature is 30° C., 40° C., or 50° C., respectively, and at the normal time, while the properties P95, P96, and P97 indicate the variation property at the load abnormality time.

In the motor rotation speed/current properties shown in FIG. 8, in the oil temperature range of 30° C. to 50° C., the properties P91, P92, and P93 in the normal state and the properties P95, P96 and P97 in the light load abnormality time indicate the properties where the difference between them becomes smaller as the motor rotation speed becomes lower. Further, in these motor rotation speed/current properties, there exists no difference region having a width that allows one common threshold value to be set between the properties P91, P92, and P93 at the normal time and the properties P95, P96, and P97 at the light load abnormality time throughout the drive duty range of 30 to 80%.

The reason why the current indicates substantially the same variation property in the motor rotation speed/current property shown in FIG. 8 and the drive duty/current property shown in FIG. 7 is that the motor rotation speed and the drive duty are proportional under a specific load condition.

For example, when a value (current value) is set in the vicinity of the center of the values in the normal time and the light load abnormality time is set as the threshold value for light load abnormality determination based on the drive duty and current property shown in FIG. 8, the determination range of the current value at the time of normal time and the light load abnormality time becomes small particularly in the region where the drive duty is small, thereby making it likely to erroneously determine the normal state as the light load abnormal state.

Figure 16:
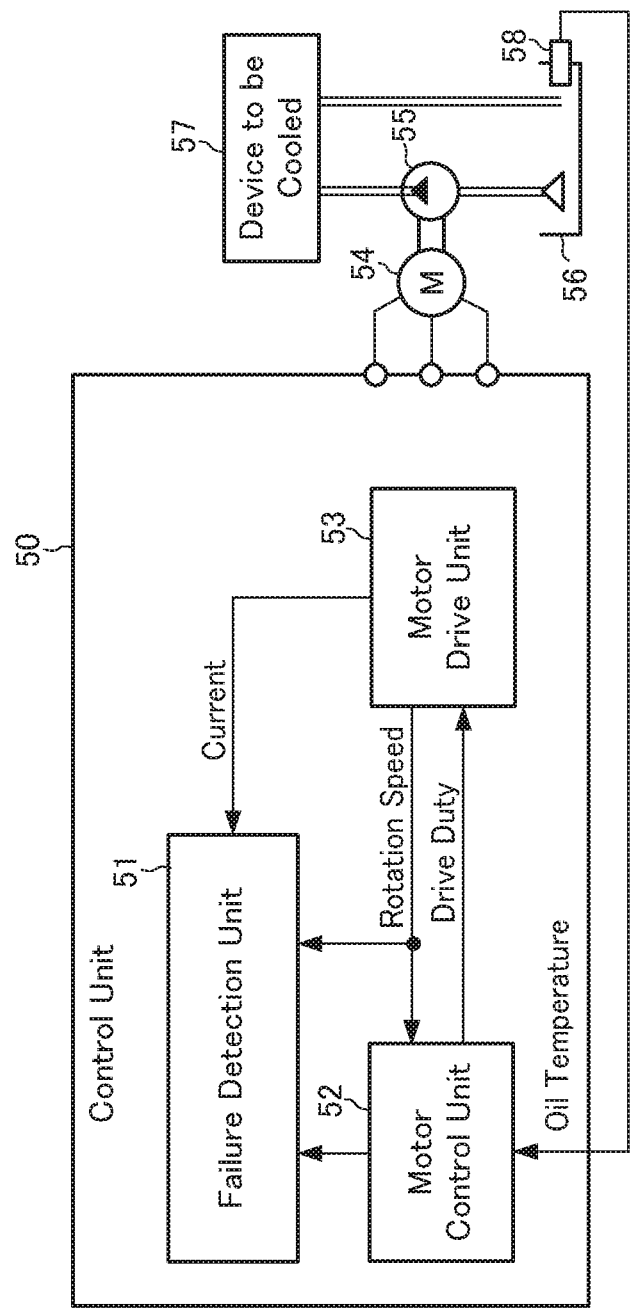
FIG. 16 is a diagram showing a schematic configuration of a conventional cooling system having a failure control section for detecting idling of an electric oil pump.
Figure 17:
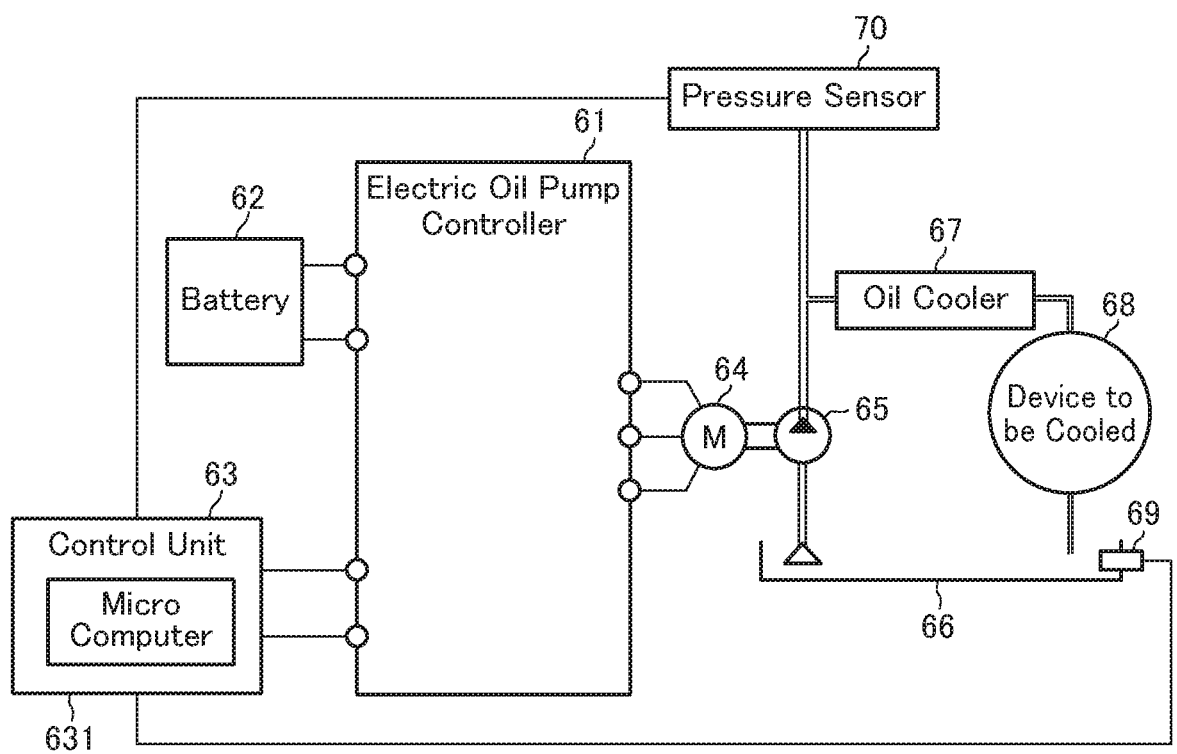
FIG. 17 is a diagram showing a schematic configuration of a conventional cooling system for determining a light load abnormality of an electric oil pump by using a pressure sensor.

In order to solve this problem, in addition to setting a threshold value corresponding to the motor rotation speed, for example, as in the conventional control apparatus for an oil pump described in FIG. 16, when determining the light load abnormality, the rotational speed of the electric oil pump 3 may be intentionally increased by increasing the rotational speed of the motor 11 so as to be greater than the required rotational speed, to thereby enlarge the difference in the current of the motor 11 between the normal state and the light load abnormal state.

However, also in this case, since it is necessary to change the rotation speed of the electric oil pump 3, that is, the drive duty of the motor 11, only the light load abnormality determination dependent on the drive duty can be performed. Therefore, in order to solve this problem, it is necessary to set a threshold corresponding to the drive duty, in which case, the light load abnormality determination process cannot help being dependent on the drive duty.

In contrast, in the failure control unit 40 according to the present embodiment, as described above, the threshold value set force by the threshold value setting section 43 is one common piping resistance equivalent value common throughout the drive duty range of 30-80% determined based on the drive duty/piping resistance equivalent value properties shown in FIG. 5.

For this reason, in the present embodiment, by setting one value of the piping resistance equivalent value between the properties P13 and P15 in the drive duty/piping resistance equivalent value property shown in FIG. 5, more specifically, by setting one value such as "700", as the threshold value for determining the light load abnormality, it is possible to accurately determine whether a light load abnormality has occurred or not, depending on whether or not the threshold value is exceeded. Namely, in the present embodiment, even when the rotational speed Ri is small, that is, even when the duty is small, since the difference between the piping resistance values between the property P13 and P15 is large, accurate light load abnormality determination can be performed. In other words, in the present embodiment, by including the failure control unit 40, it is possible to avoid erroneously determining the normal state as a light load abnormality state, independent of the drive duty.

Second Embodiment

The cooling system 1 according to the second embodiment includes a failure control unit 40 having a similar configuration as that of the cooling system 1 according to the first embodiment. However, in the failure control unit 40 of the present embodiment, the calculation section 42 calculates the 1/piping resistance equivalent value by the above-mentioned equation (2), as a load evaluation value of the electric oil pump 3, based on the drive current Ii, the motor supply voltage Vi and the motor rotation speed Ri which were inspected by the inspection section 41.

Further, prior to the light load abnormality determination process of the electric oil pump 3, the threshold value setting section 43 sets an appropriate value of 1/piping resistance equivalent value as a threshold value for light load abnormality determination. Specifically, the threshold value setting section 43 is adapted to set an appropriate 1/piping resistance equivalent value that can be commonly usable within the drive duty range of 30-80 percent as the above-mentioned threshold value, based on the variation properties of the drive duty and the 1/piping resistance equivalent value (hereinafter referred to as "drive duty/1/piping resistance equivalent value property") shown in FIG. 6.

Figure 6:
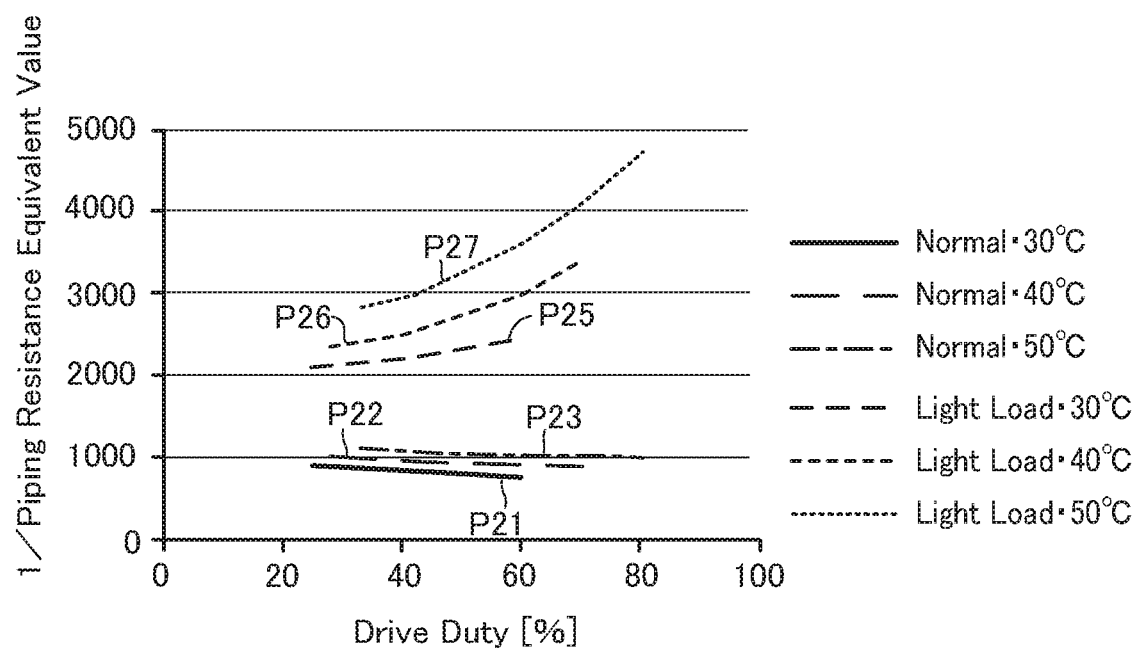
FIG. 6 is a graph showing variation property of reciprocal values of drive duty and piping resistance equivalent value of the cooling system according to the second embodiment.

In the drive duty/1/piping resistance equivalent value properties shown in FIG. 6, the properties P21, P22, and P23 indicate the variation properties at the normal time when the oil temperature is 30° C., 40° C. or 50° C., respectively, and when the light load abnormality is not occurring. Likewise, the properties P25, P26, and P27 indicate the variation property at the light load abnormality time.

According to the drive duty/1/piping resistance equivalent value properties shown in FIG. 6, in the oil temperature range of 30° C. to 50° C., there is a sufficient difference in order to set a common light load abnormality determination threshold between the properties P21, P22, and P23 in the normal time and the properties P15, P16, and P17 in the load abnormality time.

It is understood from the foregoing that, from the drive duty/1/piping resistance equivalent value properties shown in FIG. 6, whether or not there is a light load abnormality can be determined depending on which side of the threshold value the piping resistance equivalent value is calculated during the driving of the motor 11, by setting a piping resistance equivalent value between the normal value and the abnormal value in FIG. 6, in the case of determining the light load abnormality of the electric oil pump 3 within the range of oil temperature 30° C. to 50° C. and the drive duty 30 to 80 percent.

Here, the processing of each section in the failure determination processing of the failure control unit 40 according to the present embodiment will be described. Hereinafter, the case where the drive duty/1/piping resistance equivalent value properties shown in FIG. 6, for example, the 1/piping resistance equivalent value="1500" was set as a threshold value, will be described, as an example.

In this case, in the failure control unit 40 (See FIG. 4), the threshold value setting section 43 sets the 1/piping resistance equivalent value="1500" as the threshold value before performing the failure detection processing. When the motor 11 is driven with this threshold value, the failure control unit 40 performs a light load abnormality determination process of the electric oil pump 3 according to the following flow.

First, in the failure control unit 40, the inspection section 41 inspects whether or not the drive current Ii, the motor supply voltage Vi, and the motor rotation speed Ri were normally detected or acquired. Next, if these were normally detected or acquired, the calculation section 42 applies the above equation (2) based on the drive current Ii, the motor supply voltage Vi, and the motor rotational speed Ri to obtain the 1/piping resistance equivalent value.

Subsequently, the light load abnormality determination section 44 compares the piping resistance equivalent value calculated by the calculation section 42 with the threshold value (1/piping resistance equivalent value="1500") set in the threshold value setting section 43 and determines whether or not there is a light load abnormality based on the comparison result.

Here, when the piping resistance equivalent value is above the threshold value, the light load abnormality determination section 44 determines that the electric oil pump 3 is in a normal state, and determines that a light load abnormality has occurred if the piping resistance equivalent value is below the threshold value (See FIG. 6).

When it is determined by the light load abnormality determination section 44 that a light load abnormality has occurred, the abnormality notification section 45 further performs the control to notify that a light load abnormality has occurred.

As described above, the failure control unit 40 of the cooling system 1 according to the present embodiment is adapted to perform the process of: a detection step, in which the inspection section 41 detects the drive current Ii flowing in the motor 11 that drives the electric oil pump 3, the motor supply voltage Vi supplied to the motor 11 and a rotational speed Ri of the motor 11; a calculation step in which the calculation section 42 calculates a 1/piping resistance equivalent value as a load evaluation value based on the driving current Ii, the motor supply voltage Vi and the rotational speed Ri detected in the detection step; and a light load abnormality determination step in which the light load abnormality determination section 44 determines the light load abnormality of the electric oil pump 3 based on the comparison result between the 1/load evaluation value calculated in the calculation step and the threshold value set by the threshold value setting section 43.

Thus, in the failure control unit 40 according to the present embodiment, the threshold value set by the threshold value setting section 43 is a common 1/piping resistance equivalent value in the drive duty range of 30 to 80%, determined based on the drive duty 1/piping resistance equivalent value properties shown in FIG. 6.

For this reason, in the present embodiment, by setting one value of the piping resistance equivalent value between the property P23 and P25 in the drive duty/1/piping resistance equivalent value properties shown in FIG. 6, more specifically, by setting one value such as "1500", as the threshold value for determining the light load abnormality, it is possible to accurately determine whether a light load abnormality has occurred or not, depending on whether or not the threshold value is exceeded. In other words, in the present embodiment, by including the failure control unit 40, it is possible to avoid erroneously determining the normal state as a light load abnormality state, without depending on the drive duty as in the conventional control apparatus of electric oil pump as shown in FIG. 16.

Third Embodiment

Figure 9:
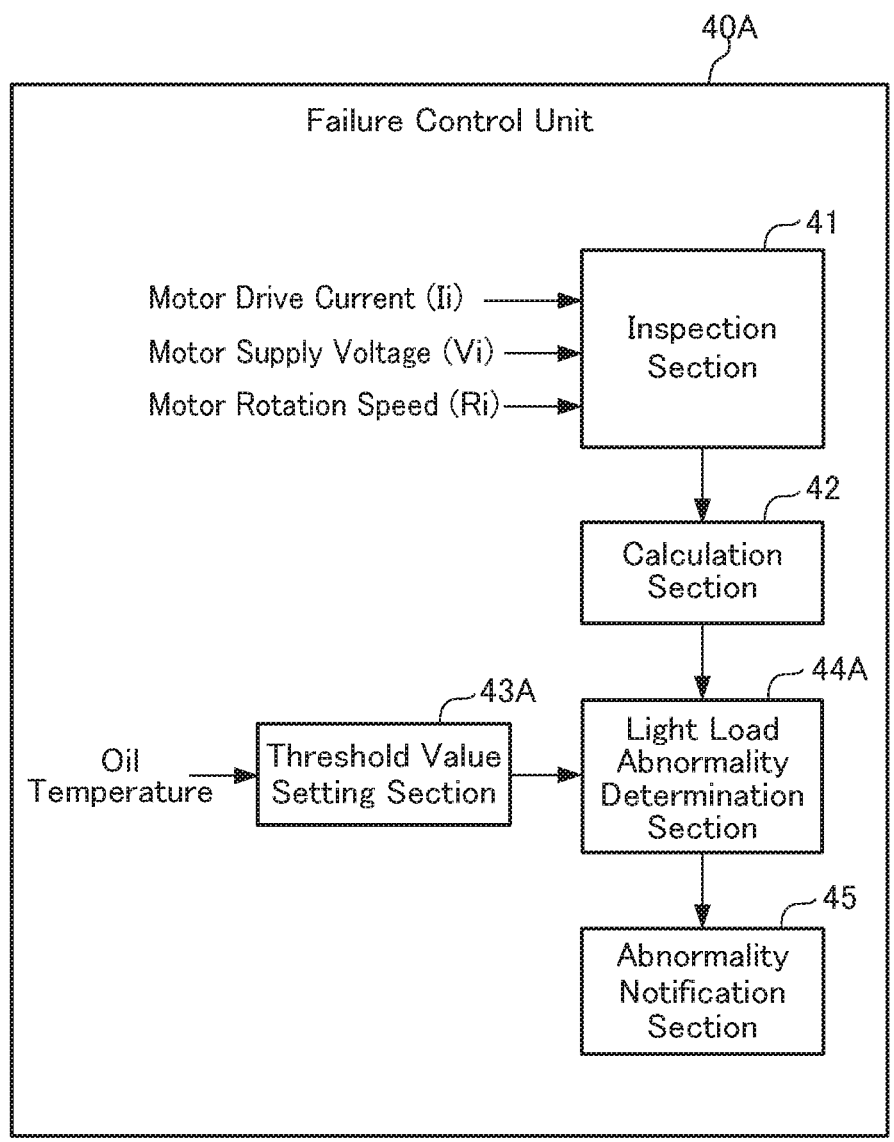
FIG. 9 is a block diagram showing a functional configuration of a failure control unit of the cooling system according to the third and fourth embodiments.

FIG. 9 is a block diagram showing a functional configuration of the failure control unit 40A of the cooling system 1 according to the third embodiment. For the failure control unit 40A according to the third embodiment, the same reference numerals are given to the same configurations as those in the first and second embodiments, the detailed description thereof will be omitted, and a configuration different from the first and second embodiments will be mainly explained.

As shown in FIG. 9, the failure control unit 40A includes an inspection section 41, a calculation section 42, a threshold value setting section 43A, a light load abnormality determination section 44A, and an abnormality notification section 45.

The calculation section 42 calculates a piping resistance equivalent value as a load evaluation value of the electric oil pump 3 by the above-mentioned equation (1).

Figure 10:
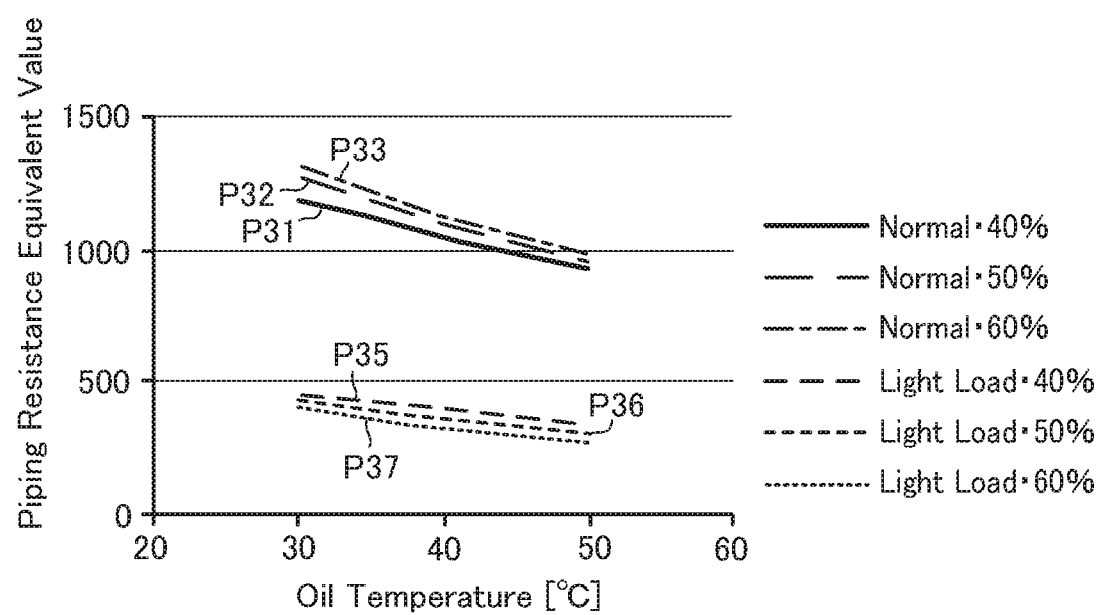
FIG. 10 is a graph showing a variation property of the oil temperature and the piping resistance equivalent value of the cooling system according to the third embodiment.

The threshold value setting section 43A sets a piping resistance equivalent value corresponding to the oil temperature as a threshold value for the light load abnormality determination processing of the electric oil pump 3, for example, based on the variation property of the oil temperature and the piping resistance equivalent value (hereinafter, oil temperature/piping resistance equivalent value property), as shown in FIG. 10.

In the oil temperature/piping resistance equivalent value properties shown in FIG. 10, the properties P31, P32, and P33 indicate the variation properties at the normal time when the drive duty is, respectively, and when the light load abnormality is not occurring. Likewise, the properties P35, P36, and P37 indicate the variation properties at the light load abnormality time.

According to the oil temperature/piping resistance equivalent value properties shown in FIG. 10, the piping resistance equivalent value of the properties at the normal time P31, P32, P33 is always greater than the piping resistance equivalent value of the properties P35, P36, and P37 at the light load abnormality time. In addition, in both of the properties P31, P32, P33 in the normal time and the properties P35, P36, P37 in the light load abnormality time, the higher the oil temperature, the higher the piping resistance equivalent value, and the lower the oil temperature, the greater the difference between them.

Thus, according to the oil temperature/piping resistance equivalent value properties shown in FIG. 10, in the range of the oil temperature being 30° C.-50° C., there exists a sufficient difference that allows a common threshold value for light load abnormality determination to be set between the properties P31, P32, P33 in the normal time and the properties P35, P36, and P37 in the load abnormality time. Therefore, in the present embodiment, it is also possible to determine a load abnormality by setting one piping resistance equivalent value between the normal value and the abnormal value in the properties shown in FIG. 10.

However, the explanation hereinafter will be made on the premise of an embodiment in which the threshold value setting section 43A sets the continuous piping resistance values corresponding to the oil temperature as the above-mentioned threshold values, based on the oil temperature/piping resistance equivalent value properties shown in FIG. 10, in order to further improve the determination accuracy of the light load abnormality.

Thereby, the light load abnormality determination section 44A compares the piping resistance equivalent value calculated by the calculation section 42 and the threshold value corresponding to the oil temperature indicated by the oil temperature signal detected by the oil temperature sensor 6 at the time, from among the threshold values set by the threshold value setting section 43, and determines the light load abnormality of the electric oil pump 3. The light load abnormality determination section 44A acquires the oil temperature signal from the microcomputer 141 of the control unit 14 through the communication interface circuit 27 (See FIG. 9).

Next, the light load abnormality determination processing in the failure control unit 40A according to the present embodiment will be explained. In the present embodiment, in the failure control unit 40A (See FIG. 4), prior to performing the light load position abnormality determination process, the threshold value setting section 43A sets continuous piping resistance equivalent values corresponding to oil temperature as threshold values based on the oil temperature/piping resistance equivalent value property shown in FIG. 10. When the motor 11 is driven with the afore-mentioned threshold values set, the failure control unit 40A performs a light load abnormality determination process of the electric oil pump 3 according to the following flow.

First, in the failure control unit 40A, the inspection section 41 inspects whether the drive current Ii, the motor supply voltage Vi, and the motor rotation speed Ri are normally detected or acquired. Here, when these are detected or acquired normally, the calculation section 42 then applies the above-mentioned equation (1) based on the driving current Ii, the motor supply voltage Vi, and the motor rotational speed Ri, so as to calculate the piping resistance equivalent value at this time.

Subsequently, the light load abnormality determination section 44A takes in the piping resistance equivalent value calculated by the calculation section 42, while acquiring the oil temperature signal transmitted from the microcomputer 141 of the control unit 14 through the communication interface circuit 27. Furthermore, the light load abnormality determination section 44A reads out a threshold value corresponding to the oil temperature indicated by the oil temperature signal from among the threshold values set by the threshold value setting section 43A, compares the threshold value with the detected piping resistance equivalent value, and determines whether or not there is a light load abnormality based on the comparison result.

Here, if the calculated piping resistance equivalent value is above the threshold value, the light load abnormality determination section 44A determines that the electric oil pump 3 is in a normal state, and determines that the light load abnormality has occurred if the calculated piping resistance equivalent value is below the threshold value, the light load abnormality determination section 44A determines that a load abnormality has occurred (See FIG. 10).

When it is determined by the light load abnormality determination section 44A that a light load abnormality has occurred, the abnormality notification section 45 further performs the control to notify that a light load abnormality has occurred.

As described above, the failure control unit 40A of the cooling system 1 according to the present embodiment is adapted to perform the processes of: a detection step, in which the inspection section 41 detects the drive current Ii flowing in the motor 11 that drives the electric oil pump 3, the motor supply voltage Vi supplied to the motor 11 and a rotational speed Ri of the motor 11; a calculation step in which the calculation section 42 calculates a piping resistance equivalent value as a load evaluation value based on the driving current Ii, the motor supply voltage Vi and the rotational speed Ri detected in the detection step; and a light load abnormality determination step in which the light load abnormality determination section 44 determines the light load abnormality based on the comparison result between the load evaluation value calculated in the above-mentioned calculation step and the threshold value corresponding to the oil temperature at this time from among the threshold values set by the threshold value setting section 43 corresponding to the oil temperature.

In the present embodiment, the threshold values set by the threshold value setting section 43A of the failure control unit 40 A are continuous piping resistance equivalent values corresponding to the oil temperature determined based on the oil temperature/piping resistance equivalent value properties having a large difference between the properties at the normal time P31, P32, P33 and the properties at the light load abnormality time P35, P36, P37, as shown in FIG. 10.

For this reason, in the present embodiment, as in the first and second embodiments, it is possible to avoid erroneously determining the normal state as a light load abnormality state, without depending on the drive duty as in the control device of the conventional electric oil pump 3 shown in FIG. 16. In addition, since continuous piping resistance equivalent values corresponding to the oil temperature are set in this embodiment, the accuracy of the light load abnormality determination can be improved compared to the case as in the first embodiment in which one piping resistance equivalent value is set as the threshold value.

Fourth Embodiment

The cooling system 1 according to the fourth embodiment includes a failure control unit 40A (See FIG. 9) having the same configuration as that of the cooling system 1 according to the third embodiment. However, in the failure control unit 40A of the present embodiment, the calculation section 42 calculates 1/piping resistance equivalent value by the above equation (2) as the load evaluation value of the electric oil pump 3 based on the drive current Ii, the motor supply voltage Vi and the motor rotation speed Ri which were inspected by the inspection section 41.

Further, prior to the light load abnormality determination process of the electric oil pump 3, the threshold value setting section 43A sets continuous appropriate values of 1/piping resistance equivalent value as threshold values for light load abnormality determination. Specifically, the threshold value setting section 43 is adapted to set the 1/piping resistance equivalent value corresponding to the oil temperature as the threshold value, for example, based on the variation properties of the oil temperature and the 1/piping resistance equivalent value (hereinafter referred to as "oil temperature/ 1/piping resistance equivalent value property") shown in FIG. 11.

Figure 11:
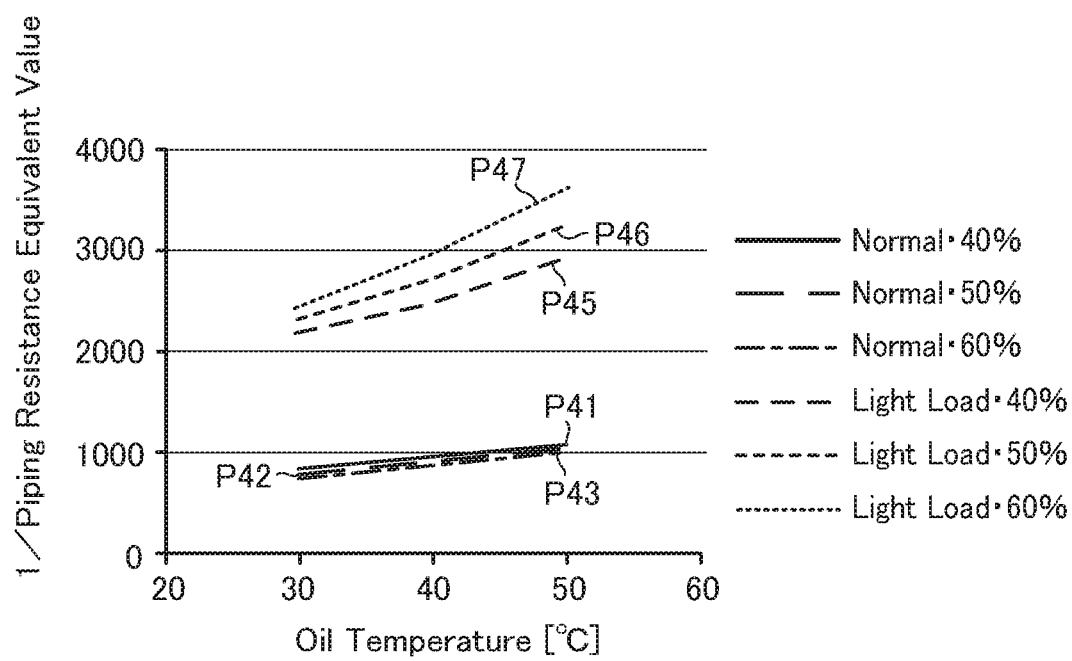
FIG. 11 is a graph showing variation property of inverse values of oil temperature and piping resistance equivalent values of the cooling system according to the fourth embodiment.

In the oil temperature/1/piping resistance equivalent value property shown in FIG. 11, the properties P41, P42, and P43 indicate the variation properties at the normal time when the drive duty is 40%, 50% or 60%, respectively, and when the light load abnormality is not occurring. Likewise, the properties P45, P46, and P47 indicate the variation properties at the light load abnormality time.

According to the oil temperature/piping resistance equivalent value properties shown in FIG. 11, the 1/piping resistance equivalent value of the properties P41, P42, P43 at the normal time is always smaller than the 1/piping resistance equivalent value of the properties P45, P46, and P47 at the light load abnormality time. In addition, in both of the properties P41, P42, P43 in the normal time and the properties P45, P46, P47 in the light load abnormality time the higher the oil temperature, the higher the 1/piping resistance equivalent value, and the lower the oil temperature, the greater the difference between them.

Thus, according to the oil temperature/piping resistance equivalent value properties shown in FIG. 11, in the range of the oil temperature being 30° C.-50° C., there exists a sufficient difference that allows a common threshold value for light load abnormality determination to be set between the properties P41, P42, P43 in the normal time and the properties P45, P46, and P47 in the load abnormality time. In the present embodiment, the threshold value setting section 43A sets the continuous 1/piping resistance equivalent values corresponding to the oil temperature as the above-mentioned threshold values, based on the oil temperature/1/piping resistance equivalent value properties shown in FIG. 11.

Thereby, the light load abnormality determination section 44A compares the 1/piping resistance equivalent value calculated by the calculation section 42 and the threshold value corresponding to the oil temperature at the time from among the threshold values set by the threshold value setting section 43, and determines the light load abnormality of the electric oil pump 3.

Next, the light load abnormality determination processing in the failure control unit 40A according to the present embodiment will be explained. In the present embodiment, in the failure control unit 40A (See FIG. 4), prior to performing the light load position abnormality determination process, the threshold value setting section 43A sets continuous piping resistance equivalent values corresponding to oil temperature as threshold values based on the oil temperature/1/piping resistance equivalent value property shown in FIG. 11. When the motor 11 is driven with the afore-mentioned threshold values set, the failure control unit 40A performs a light load abnormality determination process of the electric oil pump 3 according to the following flow.

First, in the failure control unit 40A, the inspection section 41 inspects whether the drive current Ii, the motor supply voltage Vi, and the motor rotation speed Ri are normally detected or acquired. Here, when these are detected or acquired normally, the calculation section 42 then applies the above-mentioned equation (2) based on the driving current Ii, the motor supply voltage Vi, and the motor rotational speed Ri, so as to calculate the 1/piping resistance equivalent value at this time.

Subsequently, the light load abnormality determination section 44A takes in the 1/piping resistance equivalent value calculated by the calculation section 42, while acquiring the oil temperature signal transmitted from the microcomputer 141 of the control unit 14 through the communication interface circuit 27. Furthermore, the light load abnormality determination section 44A reads out a threshold value corresponding to the oil temperature indicated by the oil temperature signal from among the threshold values set by the threshold value setting section 43A, compares the threshold value with the detected 1/piping resistance equivalent value, and determines whether or not there is a light load abnormality based on the comparison result.

Here, if the calculated 1/piping resistance equivalent value is below the threshold value, the light load abnormality determination section 44A determines that the electric oil pump 3 is in a normal state, and determines that a load abnormality has occurred if the calculated 1/piping resistance equivalent value is above the threshold value, the light load abnormality determination section 44A (See FIG. 11).

When it is determined by the light load abnormality determination section 44A that a light load abnormality has occurred, the abnormality notification section 45 further performs the control to notify that a light load abnormality has occurred.

As described above, the failure control unit 40A of the cooling system 1 according to the present embodiment is adapted to perform the process of: a detection step, in which the inspection section 41 detects the drive current Ii flowing in the motor 11 that drives the electric oil pump 3, the motor supply voltage Vi supplied to the motor 11 and a rotational speed Ri of the motor 11; a calculation step in which the calculation section 42 calculates the 1/piping resistance equivalent value as the load evaluation value based on the driving current Ii, the motor supply voltage Vi and the rotational speed Ri detected in the detection step; and a light load abnormality determination step in which the light load abnormality determination section 44 determines the light load abnormality based on the comparison result between the load evaluation value calculated in the above-mentioned calculation step and the threshold value corresponding to the oil temperature at this time from among the threshold values set by the threshold value setting section 43 corresponding to the oil temperature.

In the present embodiment, the threshold values set by the threshold value setting section 43A of the failure control unit 40 A are continuous 1/piping resistance equivalent values corresponding to the oil temperature determined based on the oil temperature/1/piping resistance equivalent value properties having a large difference between the properties P41, P42, P43 at the normal time and the properties P45, P46, P47 at the light load abnormality time, as shown in FIG. 11.

For this reason, in the present embodiment, as in the first and second embodiments, it is possible to avoid erroneously determining the normal state as a light load abnormality state, without depending on the drive duty as in the control device of the conventional electric oil pump 3 shown in FIG. 16. In addition, since continuous 1/piping resistance equivalent values corresponding to the oil temperature are set in this embodiment, the accuracy of the light load abnormality determination can be improved compared to the case as in the second embodiment in which one 1/piping resistance equivalent value is set as the threshold value.

Fifth Embodiment

Figure 12:
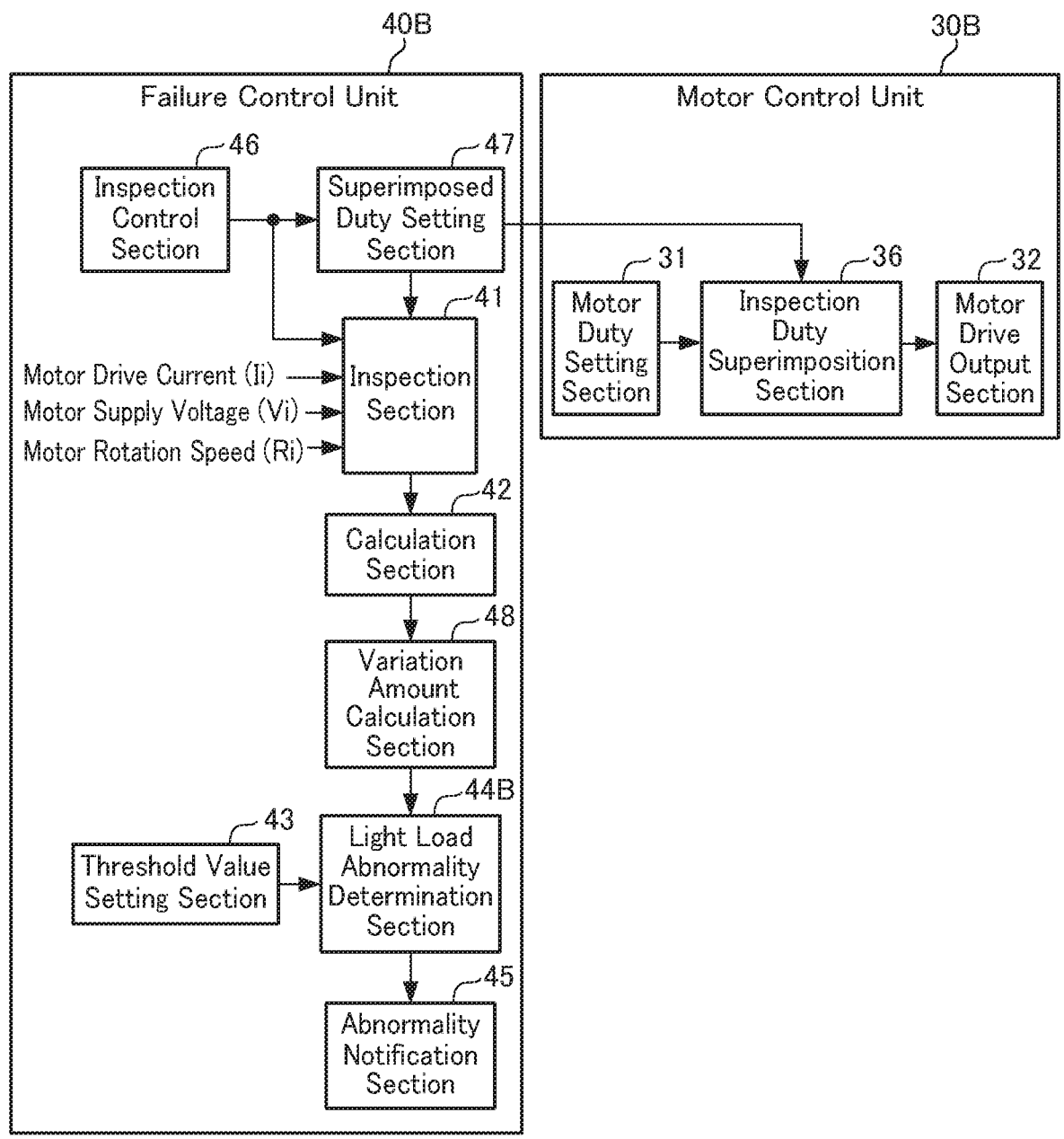
FIG. 12 is a block diagram showing a functional configuration of the failure control unit of a cooling system according to the fifth and the sixth embodiment.

FIG. 12 is a block diagram showing functional configurations of the failure control unit 40B and the motor control unit 30B of the cooling system 1 according to the fifth embodiment. With regard to the failure control unit 40B according to the fifth embodiment, the same reference numerals are given to the same configurations as those of the first to fourth embodiments, the detailed explanation thereof is omitted, and particularly the configurations which are different from the first to fourth embodiments will be mainly explained.

As shown in FIG. 12, in addition to the inspection section 41, the calculation section 42, the threshold value setting section 43 and the abnormality notification section 45 equivalent to those in the first to fourth embodiments, the failure control unit 40B of the present embodiment includes a light load abnormality determination section 44B, an inspection control section 46, a superposed duty setting section 47, and a variation amount calculation section 48.

The inspection control section 46 performs the control for a light load abnormality determination inspection (hereinafter referred to as the "inspection") for determining a light load abnormality based on the variation amount of the load evaluation value when the motor drive duty varies. To be more specific, for example, based on the light load determination timing chart shown in FIG. 13, the inspection control section 46 recognizes a period of time t0-t1 as a detection wait command duty period, and sends a preceding duty setting command and an inspection duty setting command to the superimposed duty setting section 47, respectively for superimposing a failure detection start preceding duty (hereinafter referred to as the "preceding duty") and a failure detection inspection duty (hereinafter referred to as the "inspection duty"), respectively in a subsequent period of time t1-t2 and in a period of time t2-t3.

The superimposed duty setting section 47 respectively sets the preceding duty and the inspection duty to be superimposed on the command duty, based on the preceding duty setting command and the inspection duty setting command from the inspection control section 46, and instructs the inspection duty superimposition section 36 of the motor control unit 30B, to be explained later, to superimpose each of these respective set duties.

Based on the instruction from the superimposed duty setting section 47, the variation amount calculation section 48 calculates a variation amount of a load evaluation value at a time when the preceding duty and the inspection duty are superimposed on the detection wait command duty by the inspection duty superimposition section 36 and to drive the motor 11 is driven.

After starting the inspection, the light load abnormality determination section 44B determines whether or not the light load abnormality is present by whether or not the variation amount, between the load evaluation value when the preceding duty is superimposed and the load evaluation value when the inspection duty is superimposed, detected by the variation amount calculation section 48 exceeds the threshold value set by the threshold value setting section 43.

On the other hand, as shown in FIG. 12, the motor control unit 30B of the present embodiment is provided with an inspection duty superimposition section 36 between the motor duty setting section 31 and the motor driving output section 32. The configuration of the motor control unit 30B other than described above is the same as the configuration of the motor control unit 30 shown in FIG. 2.

Based on the instruction from the superimposed duty setting section 47 of the failure control unit 40B, the inspection duty superimposition section 36 performs the control to superimpose the preceding duty and the inspection duty on the detection wait command duty, which is the drive duty at the time of normal driving, set by the motor duty setting section 31.

Next, a light load abnormality determination process by the failure control unit 40B and the motor control unit 30B according to the present embodiment will be described with reference to FIGS. 13 to 15. In the present embodiment, in the failure control unit 40B, the calculation section 42 calculates the 1/piping resistance equivalent value by the above equation (2), as the load evaluation value of the electric oil pump 3, based on the drive current Ii, the motor supply voltage Vi and the motor rotation speed Ri which were inspected by the inspection section 41.

Prior to the light load abnormality determination process of the electric oil pump 3, the threshold value setting section 43 sets an appropriate value of 1/piping resistance equivalent value as a threshold value for light load abnormality determination. For example, in the same manner as the case of the second embodiment, the threshold value setting section 43 sets the variation amount of 1/piping resistance equivalent value="+100" as the threshold value, from among the drive duty/1/piping resistance equivalent value properties shown in FIG. 6.

Figure 13:
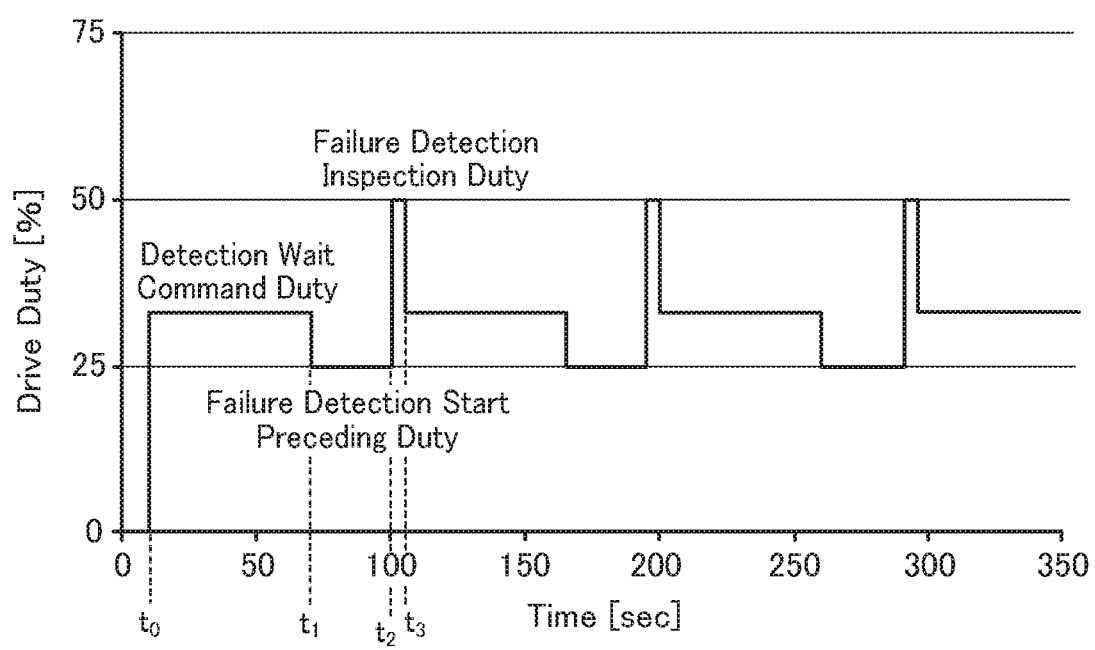
FIG. 13 is a diagram showing a light load determination timing chart in the failure control unit of a cooling system according to the fifth and the sixth embodiment.
Figure 14:
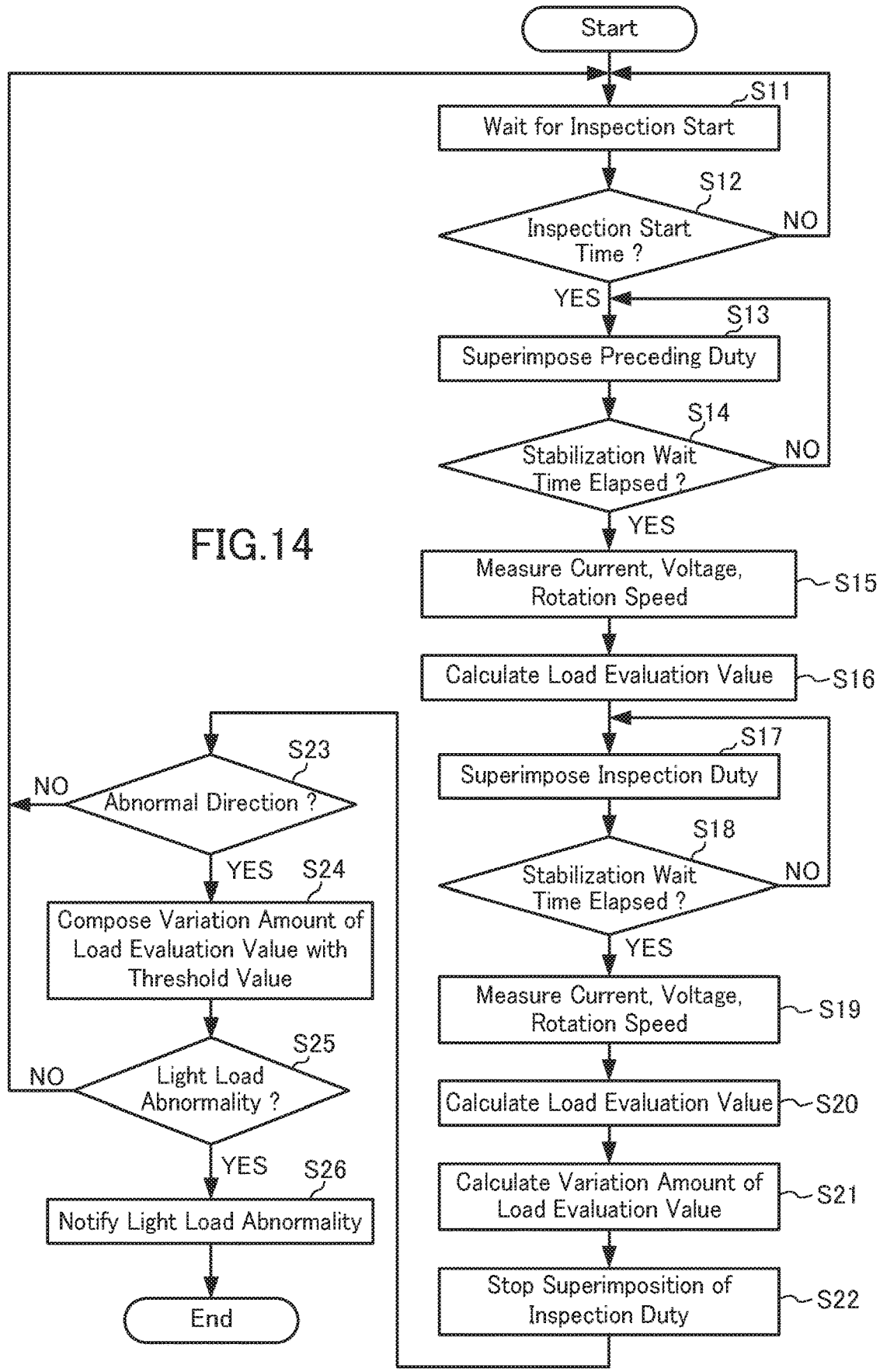
FIG. 14 is a flowchart showing the light load abnormality detection process in the failure control unit of a cooling system according to a fifth embodiment.

When the motor 11 is driven in a state in which the aforementioned threshold value is set in the threshold value setting section 43, the failure control unit 40B performs, based on the light load abnormality determination timing chart shown in FIG. 13, light load abnormality determination processing of the electric oil pump 3 along the flow chart shown in FIG. 14.

When this light load abnormality determination process is started, the inspection control section 46 monitors the elapse of the times t1, t2, t3, . . . based on the light load abnormality determination timing chart shown in FIG. 13. In addition, the inspection control section 46 performs variable control of the motor drive duty based on the preceding duty and the inspection duty according to the time and the time interval during monitoring.

First, the inspection control section 46 recognizes the section of time t0-t1 in the light load abnormality determination timing chart shown in FIG. 13 as the inspection start waiting section, during which the state of the inspection control section 46 maintains an inspection start waiting in which no instruction to superimpose the preceding duty and the inspection duty is performed (Step S11).

In the section of the time t0-t1, in the motor control unit 30B, the motor duty setting section 31 sets the detection wait command duty which is the normal drive duty, and the motor drive output section 32 drives the motor 11 based on the detection wait command duty. Here, the detection wait command duty is set to a value of, for example, 30% (See FIG. 13).

Subsequently, the inspection control section 46 determines whether or not the time t1 in the light load abnormality determination timing chart shown in FIG. 13 has been reached, that is, whether or not it is the inspection start time (Step S12). Here, if it is determined not to be the inspection start time (NO in Step S12), the inspection control section 46 maintains the inspection start waiting state in step S11.

With respect thereto, if tit is determined to be the inspection start time by reaching the time t1 (YES in Step S12), the inspection control section 46 recognizes that the preceding duty superimposition period has been reached and sends an instruction to the superimposed duty setting section 47, so as to have the inspection duty superimposition section 36 start control for superimposing the preceding duty on the detection wait command duty (Step S13).

Subsequently, the inspection control section 46 determines whether or not the time just before the time t2 in the light load abnormality determination timing chart shown in FIG. 13 has been reached, that is, whether or not the stabilization waiting time of the preceding duty has elapsed (Step S14). Here, if the stabilization waiting time of the preceding duty is determined to have not elapsed (NO in step S14), the inspection control section 46 causes the preceding duty superimposing process of the aforementioned step S13 to continue.

In step S13, the inspection control section 46 performs the control so that the duty after superimposing the preceding duty becomes lower than the detection wait command duty, for example, 25%. This means that the inspection control section 46 performs a process of superimposing the preceding duty of −5% on the detection wait command duty (See FIG. 13).

Thereafter, it is determined that the time t2 in the light load abnormality determination timing chart of FIG. 13 has been reached and the stabilization waiting time of the preceding duty has elapsed (YES in step S14). Upon recognizing this, the inspection section 41 measures the drive current Ii, the motor supply voltage Vi, and the motor rotation speed Ri of the motor 11 (Step S15), and the calculation section 42 calculates the 1/piping resistance equivalent value as the load evaluation value (Step S16).

Thereafter, when the time t2 in the light load abnormality determination timing chart shown in FIG. 13 is reached, the inspection control section 46 recognizes that the inspection duty superimposition period has been reached and sends a command to the superimposed duty setting section 47, and the superimposition section 36 start control for superimposing the inspection duty on the detection wait command duty (Step S17).

In step S17, the inspection control section 46 performs the control so that the duty after superimposing the inspection duty becomes higher than the detection wait command duty, for example, 50%. This means that the inspection control section 46 performs a process of superimposing an inspection duty of +20% on the detection wait command duty (See FIG. 13).

Subsequently, the inspection control section 46 determines whether or not the time just before the time t3 in the light load abnormality determination timing chart shown in FIG. 13 has been reached, that is, whether or not the stabilization waiting time of the inspection duty has elapsed. Here, if it is determined that the stabilization waiting time of the inspection duty has elapsed (NO in step S18), the inspection control section 46 proceeds to the inspection duty superposition processing in step S17.

Thereafter, if it is determined that the time t3 in the light load abnormality determination timing chart of FIG. 13 has reached and the stabilization waiting time of the inspection duty has elapsed (YES in step S18). Upon recognizing this, the inspection section 41 measures the drive current Ii, the motor supply voltage Vi, and the motor rotation speed Ri of the motor 11 (Step S19), and the calculation section 42 calculates the 1/piping resistance equivalent value as the load evaluation value (Step S20).

Next, the variation amount calculation section 48 calculates the variation amount between the 1/piping resistance equivalent value calculated by the calculation section 42 in the above step S16 and the 1/piping resistance equivalent value calculated thereafter by the calculation section 42 in the above step S20 (Step S21).

Subsequently, the inspection control section 46 stops the control of superimposing the inspection duty which has been performed since step S17 (Step S22).

Thereafter, the light load abnormality determination section 44B detects a variation direction of the 1/piping resistance equivalent value at the time when the preceding duty is superimposed and at the time when the inspection duty is superimposed based on the variation amount of the 1/piping resistance equivalent value calculated by the variation amount calculation section 47 in the aforementioned step S21, and determines whether or not the variation direction is an abnormal direction (Step S23).

The determination of the variation direction may be performed, for example, based on the drive duty/1/piping resistance equivalent value property shown in FIG. 6. According to the drive duty/1/piping resistance equivalent value properties shown in FIG. 6, the property in which the 1/piping resistance equivalent value decreases (drops) when the drive duty increases in the light load normal state, and conversely, the 1/piping resistance equivalent value increases (rises) when the drive duty increases in the light load abnormal state can be observed. Accordingly, in step S23, the light load abnormality determination section 44B may determine the normal state if the variation direction of the 1/piping resistance equivalent value is a normal direction, or a dropping direction, and an abnormal state if the variation direction of the 1/piping resistance equivalent value is an abnormal direction, or a rising direction.

If it is determined that the variation direction of 1/piping resistance equivalent value is not in an abnormal direction (NO in step S23) in the determination of the variation direction, the inspection control section 46 continues the processing from step S11.

On the other hand, if the variation direction of 1/piping resistance equivalent value is determined to be in the abnormal direction (YES in step S23), the light load abnormality determination section 44B compares the load evaluation value calculated in the aforementioned step S21 with the threshold value set in the threshold value setting section 43, for example, 1/piping resistance equivalent value="1500" (Step S24), and determines whether or not the light load abnormality is present based on the comparison result (Step S25).

Here, the light load abnormality determination section 44B determines that the electric oil pump 3 is in a normal state when the variation amount of 1/piping resistance equivalent value is smaller than the threshold value (NO in step S25), in which case, the light load abnormality determination processing returns to the processing from step S11. On the other hand, when the variation amount of 1/piping resistance equivalent value is greater than the threshold value, the light load abnormality determination section 44B determines that a light load abnormality has occurred (YES in step S25).

When the light load abnormality determination section 44B determines that a light load abnormality has occurred, the abnormality notification section 45 performs the control to notify that a light load abnormality has occurred. After notifying the occurrence of the light load abnormality, a series of the light load abnormality determination processing is completed.

Figure 15:
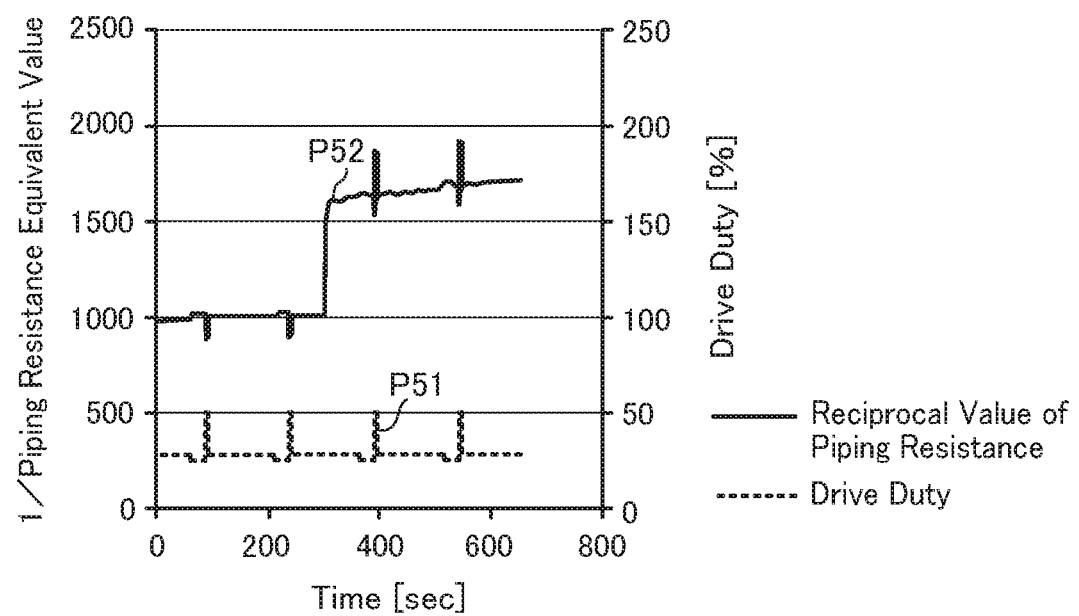
FIG. 15 is a view showing a variation property of an inverse numerical value of the piping resistance equivalent value at the time of determining a light load abnormality of the cooling system according to the present embodiment.

FIG. 15 is a figure showing a variation property of the 1/piping resistance equivalent value (hereinafter also referred to as the "inspection property") at the time of the light load abnormality determination (inspection) based on the light load determination timing of the cooling system 1 according to the present embodiment shown in FIG. 13. In FIG. 14, in particular, the variation property of the 1/piping resistance equivalent value when pipe disconnection occurs in the hydraulic piping system of the cooling mechanism section 10 is shown.

In FIG. 15, the line segment P51 indicated by the dotted line in the lower portion shows the variation pattern of the drive duty in FIG. 13. In addition, in FIG. 15, a line segment P52 indicated by a solid line in the upper portion shows the inspection property of the 1/piping resistance equivalent value when the inspection is performed by varying the drive duty with a variation pattern indicated by the line segment P51. Further, in FIG. 15, the portion where the 1/piping resistance equivalent value indicated by the line segment P52 rapidly changes from "1000" to "over 1500" indicates an inspection property caused by a pipe disconnection which occurred at that time, or in the vicinity of the time 300 (second).

According to the inspection property of the 1/piping resistance equivalent value shown in FIG. 15, it can be understood that the light load abnormality can be determined by setting the variation amount of the 1/piping resistance equivalent value="+100" as the threshold value by the threshold value setting section 43. To be specific, it can be understood that, by superimposing the preceding duty and the inspection duty on the detection wait command duty, the drive duty is decreased once and then increased so that the variation amount of 1/piping resistance equivalent value during this time is increased, thereby making it possible to determine whether the light load is normal or abnormal depending on whether the variation amount of the 1/piping resistance equivalent value during this time is smaller or greater than that of the aforementioned threshold value.

This type of system has a property in which the drive duty of the motor cannot be increased, since the viscosity of the oil is high at a low temperature, and the intake negative pressure of the electric oil pump becomes too large. In this respect, as described above, the cooling system 1 according to the present embodiment can increase the duty variation amount by temporarily decreasing the drive duty and then increasing the drive duty, thereby contributing for to the secure prevention of an erroneous determination of the light load abnormality.

Sixth Embodiment

The cooling system 1 according to the sixth embodiment includes a failure control unit 40B and a motor control unit 30B (See FIG. 12) having the same configuration as the cooling system 1 according to the fifth embodiment. Hereinafter, the description of the failure control unit 40B according to the sixth embodiment, which is similar to the fifth embodiment will be omitted, and the configurations which are different from the fifth embodiment will be mainly explained.

In the failure control unit 40B of the present embodiment, the calculation section 42 calculates the load evaluation value of the electric oil pump 3 by the aforementioned equation (1), based on the drive current Ii, the motor supply voltage Vi and the motor rotation speed Ri which were inspected by the inspection section 41. Prior to the light load abnormality determination process of the electric oil pump 3, the threshold value setting section 43 sets, for example, the variation amount of the piping resistance equivalent value="−50" as the threshold value for determination of the light load abnormality, based on the drive duty/piping resistance equivalent value properties shown in FIG. 5.

In the cooling system 1 according to the present embodiment having such a configuration, the calculation section 42 respectively calculates the piping resistance equivalent values as load evaluation values in the failure control unit 40B, in steps S16 and S20 in the flowchart shown in FIG. 14.

In step 21, the variation amount calculation section 48 calculates a variation amount between the piping resistance equivalent value calculated in step S16 and the piping resistance equivalent value calculated in step S20.

Further, in step S23, the light load abnormality determination section 44B determines that the variation direction of the piping resistance equivalent value is the normal direction if the variation direction is a rising direction and the abnormal direction if the variation direction of the piping resistance value is a dropping direction. Thereafter, in step S25, the light load abnormality determination section 44B determines that the electric oil pump 3 is in the normal state when the variation amount of the piping resistance equivalent value is greater than the threshold value, and that the electric oil pump 3 is in the light load abnormality state when the variation amount of the piping resistance equivalent value is smaller than the threshold value (See FIG. 5).

Thus, in the failure control unit 40B of the cooling system 1 according to the fifth and sixth embodiments, the drive duty is varied while the motor 11 is driven, the variation amount of the load evaluation value (piping resistance equivalent value or 1/piping resistance equivalent value) is calculated, and the light load abnormality is determined based on the comparison result between the variation amount of the load evaluation value and the threshold value.

According to the configurations of the fifth and sixth embodiments, it is possible to determine the light load abnormality without using a pressure sensor in the same manner as the first to fourth embodiments. Further, in the fifth and sixth embodiments, the oil temperature sensor is unnecessary, and it is possible to determine the light load abnormality without depending on the oil temperature, that is, without the oil temperature data.

Further, the configurations of the fifth and the sixth embodiments can be used together with those of the first and the second embodiments, in which the light load abnormality is determined with one threshold value relating to the piping resistance equivalent value or 1/piping resistance equivalent value, and together with those of the third and the fourth embodiments, in which the light load abnormality is determined with the continuous piping resistance equivalent values or 1/piping resistance equivalent values as the threshold values. In this case, for example, by applying the method (the fifth and the sixth embodiments) in which the drive duty is varied after applying the method (the first to the fourth embodiments) in which the drive duty is not varied, it is possible to reliably prevent the erroneous determination of the normal state as the light load abnormality state.

In order to solve the above problem, in the present embodiment, the light load abnormality determination method of the electric oil pump 3 comprises: a detection step (inspection section 41) to detect a current Ii flowing through the motor 11, a voltage Vi supplied to the motor 11, and a rotation speed Ri of the motor 11; a calculation step (calculation step 42) to calculate a piping resistance equivalent value represented by the aforementioned formula (1) or a reciprocal value of the piping resistance equivalent value represented by the aforementioned formula (2), as a load evaluation value for light load abnormality determination, based on the current Ii, the voltage Vi and the rotation speed Ri detected by the detection step; and a light load abnormality determination step (light load abnormality determination section 44, 44A, 44B) to determine a light load abnormality of the electric oil pump 3 based on the load evaluation value. By this configuration, in the present embodiment, it is possible to provide a light load abnormality determination method of the electric oil pump 3 that can, with an inexpensive configuration, reliably prevent an erroneous determination related to a light load abnormality, without using a pressure sensor, utilizing the property of the piping resistance equivalent value and the 1/piping resistance equivalent value that the difference between the value at a normal time and the value at a light load abnormality time is large.

Further, in the present embodiment, the light load abnormality determination step compares the load evaluation value with a threshold value and determines the light load abnormality of the electric oil pump, depending on which side of the threshold value the load evaluation value is present. Further, in the present embodiment, the light load abnormality determination method of the electric oil pump 3 further comprises a threshold value setting step (threshold value setting section 43, 43A) to set the threshold value. By this configuration, in the present embodiment, it is possible to reduce the erroneous determination of the light load abnormality, since the determination width can be extended by setting a value in the vicinity of the middle of the difference in the piping resistance equivalent value and the 1/piping resistance equivalent value as a threshold value.

Further, in the present embodiment, the threshold value setting step sets the threshold value corresponding to the piping resistance equivalent value, and the light load abnormality determination step determines that the light load abnormality is present when the piping resistance equivalent value calculated in the calculation step is smaller than the threshold value. By this configuration, in the present embodiment, whether the light load abnormality is present or not can be accurately determined according to whether the detected piping resistance equivalent value is on the lower side or on the upper side of the threshold value, by setting a value in the vicinity of the middle of the difference between the value at the normal time and the value at the light load abnormality time as a threshold value, for example, based on the drive duty/piping resistance equivalent value properties shown in FIG. 5.

Further, in the present embodiment, the threshold value setting step sets the threshold value corresponding to the 1/piping resistance equivalent value, and the light load abnormality determination step determines that the light load abnormality is present when the 1/piping resistance equivalent value calculated in the calculation step is greater than the threshold value. By this configuration, in the present embodiment, whether the light load abnormality is present or not can be accurately determined according to whether the detected 1/piping resistance equivalent value is on the upper side or on the lower side of the threshold value, by setting a value in the vicinity of the middle of the difference between the value at the normal time and the value at the time of the light load abnormality time as a threshold value, for example, based on the drive duty/1/piping resistance equivalent value properties shown in FIG. 6.

Further, in the present embodiment, the threshold value setting step sets the threshold value corresponding to the piping resistance equivalent value corresponding to the oil temperature, and the light load abnormality determination step determines that the light load abnormality is present when the piping resistance equivalent value calculated in the calculation step is smaller than the threshold value. By this configuration, in the present embodiment, whether the light load abnormality is present or not can be accurately determined according to the detected piping resistance equivalent value is in a lower side or in an upper side of the threshold value, by setting values in the vicinity of the middle of the difference between the value at the normal time and the value at the light load abnormality time as continuous threshold values corresponding to the oil temperature, for example, based on the oil temperature/1/piping resistance equivalent value properties shown in FIG. 10.

Further, in the present embodiment, the threshold value setting step sets the threshold value corresponding to the reciprocal value of the piping resistance equivalent value corresponding to the oil temperature, and the light load abnormality determination step determines that the light load abnormality is present when the reciprocal value of the piping resistance equivalent value calculated in the calculation step is greater than the threshold value. By this configuration, in the present embodiment, whether the light load abnormality is present or not can be accurately determined according to the detected 1/piping resistance equivalent value is on the upper side or on the lower side of the threshold value, by setting the value in the vicinity of the middle of the difference between the value at the normal time and the value at the light load abnormality time as continuous threshold values corresponding to the oil temperature, for example, based on the oil temperature/1/piping resistance equivalent value properties shown in FIG. 11.

Further, in the present embodiment, the light load abnormality determination method of the electric oil pump 3 further comprises a drive duty varying step (inspection control section 46, superimposed duty setting section 47, inspection duty setting section 6 and S13 and S17 of FIG. 14) to vary a drive duty of the motor 11, and a variation amount calculation step (variation amount calculation step 48 and S21 of FIG. 14) to calculate a variation amount of the load evaluation value corresponding to a variation of the drive duty within a predetermined variation range, and the light load abnormality determination step (light load abnormality determination unit 44B, S25 of FIG. 14) determines a light load abnormality of the electric oil pump 3 based on the variation amount of the load evaluation value. By this configuration, in the present embodiment, it is possible to accurately determine the light load abnormality, based on the variation direction and the variation amount of the load evaluation value corresponding to the variation of the drive duty within a predetermined variation range, without using a pressure sensor and an oil temperature sensor.

The present invention is not limited to the above-described one embodiment, and various modifications and applications are possible. For example, in the above-described embodiments, an example of the application to a cooling system for cooling a vehicle motor and a generator of a hybrid vehicle is mentioned, however the present invention is not limited thereto and the present invention may be applied to various systems in which oil is supplied to an object to be cooled by circulating with an electric oil pump driven by a motor.

As described above, according to the present invention, it is possible to provide a light load abnormality determination method for an electric oil pump which can, with an inexpensive configuration, reliably prevent the erroneous determination of a light load abnormality. The present invention is generally useful for light load abnormality determination methods of an electric oil pump using a brushless DC motor.

EXPLANATION OF REFERENCE NUMERALS 1 cooling system
3 electric oil pump
5 device to be cooled
11 motor
12 electric oil pump controller
21 microcomputer
30, 30B motor control unit
35 motor rotation speed calculation section
36 inspection duty superimposition section
40, 40A, 40B failure control unit
41 inspection section
42 calculation section
43, 43A threshold value setting section
44, 44A, 44B light load abnormality determination section
46 inspection control section
47 superimposed duty setting section
48 variation amount calculation section
Ii drive current
Vi motor supply voltage
Ri motor speed

The invention claimed is:

1. A light load abnormality determination method for an electric oil pump that circulates and supplies oil to an object to be cooled by the electric oil pump driven by a motor, the method comprising:
a detection step to detect an electric current flowing through the motor, a voltage supplied to the motor, and a rotation speed of the motor;
a calculation step to calculate a piping resistance equivalent value represented by the following formula (1) or a reciprocal value of the piping resistance equivalent value represented by the following formula (2), as a load evaluation value for light load abnormality determination, based on the electric current, the voltage and the rotation speed detected by the detection step; and
a light load abnormality determination step to determine a light load abnormality of the electric oil pump based on the load evaluation value, wherein
formula 1 represents, piping resistance equivalent value=first coefficient×electric current×voltage/rotation speed$^2$,
formula 2 represents, reciprocal value of the piping resistance equivalent value=second coefficient×rotation speed$^2$/(electric current×voltage).

2. The light load abnormality determination method for an electric oil pump according to claim 1, wherein
the light load abnormality determination step compares the load evaluation value with a threshold value and determines the light load abnormality of the electric oil pump, depending on which side of the threshold value the load evaluation value is present.

3. The light load abnormality determination method for an electric oil pump according to claim 2, further comprising a threshold value setting step to set the threshold value.

4. The light load abnormality determination method for an electric oil pump according to claim 3, wherein
the threshold value setting step sets the threshold value corresponding to the piping resistance equivalent value, and
the light load abnormality determination step determines that the light load abnormality is present when the piping resistance equivalent value calculated in the calculation step is smaller than the threshold value.

5. The light load abnormality determination method for an electric oil pump according to claim 3, wherein
the threshold value setting step sets the threshold value corresponding to the reciprocal value of the piping resistance equivalent value, and
the light load abnormality determination step determines that the light load abnormality is present when the reciprocal value of the piping resistance equivalent value calculated in the calculation step is greater than the threshold value.

6. The light load abnormality determination method for an electric oil pump according to claim 3, wherein
- the threshold value setting step sets the threshold value corresponding to the piping resistance equivalent value corresponding to the oil temperature, and
- the light load abnormality determination step determines that the light load abnormality is present when the piping resistance equivalent value calculated in the calculation step is smaller than the threshold value.

7. The light load abnormality determination method for an electric oil pump according to claim 3, wherein
- the threshold value setting step sets the threshold value corresponding to the reciprocal value of the piping resistance equivalent value corresponding to the oil temperature, and
- the light load abnormality determination step determines that the light load abnormality is present when the reciprocal value of the piping resistance equivalent value calculated in the calculation step is greater than the threshold value.

8. The light load abnormality determination method for an electric oil pump according to claim 1, further comprising
- a drive duty varying step to vary a drive duty of the motor, and
- a variation amount calculation step to calculate a variation amount of the load evaluation value corresponding to the variation of the drive duty within a predetermined variation range, wherein
- the light load abnormality determination step determines a light load abnormality of the electric oil pump based on the variation amount of the load evaluation value.

* * * * *